United States Patent
Park et al.

(10) Patent No.: US 11,205,759 B2
(45) Date of Patent: Dec. 21, 2021

(54) DISPLAY APPARATUS INCLUDING AN ANTI-CRACK PROJECTION

(71) Applicant: SAMSUNG DISPLAY CO., LTD., Yongin-si (KR)

(72) Inventors: Yonghan Park, Yongin-si (KR); Sangmin Kim, Yongin-si (KR); Dongho Lee, Yongin-si (KR); Hyunjung Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/503,774

(22) Filed: Jul. 5, 2019

(65) Prior Publication Data

US 2020/0013971 A1    Jan. 9, 2020

(30) Foreign Application Priority Data

Jul. 6, 2018   (KR) .................. 10-2018-0078925

(51) Int. Cl.
| | | |
|---|---|---|
| *H01L 51/00* | (2006.01) | |
| *H01L 27/32* | (2006.01) | |
| *H01L 51/52* | (2006.01) | |
| *B32B 3/26* | (2006.01) | |
| *B32B 3/04* | (2006.01) | |

(52) U.S. Cl.
CPC ............ *H01L 51/0097* (2013.01); *B32B 3/04* (2013.01); *B32B 3/26* (2013.01); *H01L 27/3244* (2013.01); *H01L 51/5253* (2013.01); *B32B 2307/546* (2013.01); *B32B 2457/20* (2013.01); *H01L 2251/5338* (2013.01)

(58) Field of Classification Search
CPC ............ H01L 51/0097; H01L 51/5253; H01L 51/3244; B32B 3/04; B32B 3/26
See application file for complete search history.

(56) References Cited

U.S. PATENT DOCUMENTS

| | | |
|---|---|---|
| 9,685,626 B2 | 3/2017 | Gao et al. |
| 9,871,081 B2 | 1/2018 | Kim |
| | (Continued) | |

FOREIGN PATENT DOCUMENTS

| | | |
|---|---|---|
| KR | 10-2016-0114220 | 10/2016 |
| KR | 10-2017-0049146 | 5/2017 |
| KR | 10-2017-0128683 | 11/2017 |

*Primary Examiner* — Matthew E. Gordon
(74) *Attorney, Agent, or Firm* — F. Chau & Associates, LLC

(57) ABSTRACT

A display apparatus includes a substrate including a display area, a peripheral area outside the display area, and a bending area bendable along a bending axis, and an anti-crack projection disposed in the peripheral area and extending along at least a part of an edge of the substrate. A portion of the anti-crack projection in the bending area is a bending portion. A preset area including the bending portion on the substrate is a first area. A preset area of the substrate disposed outside the first area, having substantially the same area as that of the first area, and including a part of the anti-crack projection is a second area. A portion of the anti-crack projection belonging to the second area is a flat portion. The area occupied by the bending portion in the first area is greater than the area occupied by the flat portion in the second area.

16 Claims, 16 Drawing Sheets

(56) References Cited

U.S. PATENT DOCUMENTS

| | | | | |
|---|---|---|---|---|
| 2014/0118975 | A1* | 5/2014 | Chen | H05K 1/0281 |
| | | | | 361/761 |
| 2017/0062534 | A1* | 3/2017 | Jiang | H01L 51/5253 |
| 2017/0125734 | A1* | 5/2017 | Lee | H01L 27/3246 |
| 2018/0240852 | A1* | 8/2018 | Chen | H01L 27/3258 |

* cited by examiner

DISPLAY APPARATUS INCLUDING AN ANTI-CRACK PROJECTION

CROSS-REFERENCE TO RELATED APPLICATION

This application claims priority under 35 U.S.C. § 119 to Korean Patent Application No. 10-2018-0078925, filed on Jul. 6, 2018 in the Korean Intellectual Property Office, the disclosure of which is incorporated by reference herein in its entirety.

TECHNICAL FIELD

Exemplary embodiments of the inventive concept relate to a display apparatus, and more particularly, to a display apparatus for preventing or minimizing defects in a manufacturing process.

DISCUSSION OF RELATED ART

In general, a display apparatus has a structure in which various layers are stacked. For example, in an organic light-emitting display apparatus, each sub-pixel includes an organic light-emitting device, and the organic light-emitting device includes a pixel electrode, an intermediate layer including an emission layer, and a counter electrode. A thin-film transistor (TFT) is electrically connected to the organic light-emitting device, and insulating layers disposed between a semiconductor layer, a gate electrode, a source electrode, and a drain electrode of the TFT are also elements of the organic light-emitting display apparatus.

The organic light-emitting display apparatus may include various layers in addition to the above elements. Additionally, a display apparatus (e.g., a liquid crystal display apparatus) other than the organic light-emitting display apparatus may also include various layers.

In a conventional display apparatus, cracks may easily occur due to an external impact during a manufacturing process or during use after the manufacturing process.

SUMMARY

According to an exemplary embodiment of the inventive concept, a display apparatus includes a substrate including a display area where display devices are disposed, a peripheral area outside the display area, and a bending area bendable along a bending axis, and an anti-crack projection disposed in the peripheral area of the substrate and extending along at least a part of an edge of the substrate. A portion of the anti-crack projection in the bending area is a bending portion, a preset area including the bending portion on the substrate is a first area, a preset area of the substrate disposed outside the first area, having substantially the same area as that of the first area, and including a part of the anti-crack projection is a second area, and a portion of the anti-crack projection belonging to the second area is a flat portion. The area occupied by the bending portion in the first area is greater than the area occupied by the flat portion in the second area.

A width of the bending portion may be greater than a width of the flat portion.

The display apparatus may further include a wiring disposed in the peripheral area of the substrate between the anti-crack projection and the display area and extending along at least a part of the edge of the substrate. A distance between an edge of the wiring close to the anti-crack projection and an edge of the anti-crack projection close to the wiring is substantially the same in the first area and the second area.

The display apparatus may further include a wiring disposed in the peripheral area of the substrate between the anti-crack projection and the display area and extending along at least a part of the edge of the substrate. An edge of the wiring close to the anti-crack projection has a concave portion recessed inward away from the bending portion to correspond to the bending portion.

The display apparatus may further include a cover layer covering the anti-crack projection and extending in a direction in which the anti-crack projection extends.

A width of a portion of the cover layer corresponding to the bending portion may be greater than a width of a portion of the cover layer corresponding to the flat portion.

The cover layer may include a convex portion that is convex toward the display area to correspond to the bending portion and a convex portion that is convex away from the display area.

The display apparatus may further include an encapsulation layer covering the display devices in the display area and extending to the peripheral area. A distance between an edge of the encapsulation layer close to the anti-crack projection and an edge of the anti-crack projection close to the encapsulation layer in the second area is greater than that in the first area.

The anti-crack projection may include a first projection extending into the first area from a first side of the first area and a second projection extending into the first area from a second side of the first area. The second projection in the first area is disposed closer to the display area than the first projection, and the bending portion includes a part of the first projection and a part of the second projection.

The display apparatus may further include a wiring disposed in the peripheral area of the substrate between the anti-crack projection and the display area and extending along at least a part of the edge of the substrate. A distance between an edge of the wiring close to the second projection and an edge of the second projection close to the wiring in the first area is substantially the same as a distance between an edge of the wiring close to the first projection and an edge of the first projection close to the wiring in the second area.

An edge of the wiring close to the anti-crack projection may have a curved portion corresponding to a position of a front end portion of the second projection.

The display apparatus may further include a cover layer covering the anti-crack projection and extending in a direction in which the anti-crack projection extends.

A width of a portion of the cover layer corresponding to the bending portion may be greater than a width of a portion of the cover layer corresponding to the flat portion.

A distance between an edge of the cover layer close to the display area and an edge of the display area close to the cover layer on the first side of the first area may be greater than a distance between an edge of the cover layer close to the display area and an edge of the display area close to the cover layer on the second side of the first area.

The display apparatus may further include an encapsulation layer covering the display devices in the display area and extending to the peripheral area. A distance between an edge of the encapsulation layer close to the first projection and an edge of the first projection close to the encapsulation layer on the first side of the first area is greater than a distance between an edge of the encapsulation layer close to the second projection and an edge of the second projection close to the encapsulation layer on the second side of the first area.

The bending axis may include a first bending axis and a second bending axis that are different, and the bending area may include a first bending area and a second bending area that are different.

According to an exemplary embodiment of the inventive concept, a display apparatus includes a substrate including a display area where display devices are disposed, a peripheral area outside the display area, and a bending area bendable along a bending axis, a first anti-crack projection disposed in the peripheral area of the substrate and extending along at least a part of an edge of the substrate, and a second anti-crack projection disposed in the peripheral area of the substrate between the display area and the first anti-crack projection and extending along at least a part of the edge of the substrate. A portion of the first anti-crack projection and a portion of the second anti-crack projection in the bending area are respectively a first bending portion and a second bending portion, a preset area including the first bending portion and the second bending portion on the substrate is a first area, a preset area of the substrate disposed outside the first area and including a part of the first anti-crack projection and a part of the second anti-crack projection is a second area, and a portion of the first anti-crack projection and a portion of the second anti-crack projection belonging to the second area are respectively a first flat portion and a second flat portion. A distance between the first bending portion and the second bending portion in the first area is greater than a distance between the first flat portion and the second flat portion in the second area.

The second anti-crack projection may have a curved shape, and a distance between the second bending portion and the display area may be less than a distance between the second flat portion and the display area.

The display apparatus may further include a wiring disposed in the peripheral area of the substrate between the second anti-crack projection and the display area and extending along at least a part of the edge of the substrate. A distance between an edge of the wiring close to the second anti-crack projection and an edge of the second anti-crack projection close to the wiring is substantially the same in the first area and the second area.

The display apparatus may further include a wiring disposed in the peripheral area of the substrate between the second anti-crack projection and the display area and extending along at least a part of the edge of the substrate. An edge of the wiring close to the second anti-crack projection has a concave portion recessed inward away from the second bending portion to correspond to the second bending portion.

The display apparatus may further include an encapsulation layer covering the display devices in the display area and extending to the peripheral area. A distance between an edge of the encapsulation layer close to the second anti-crack projection and an edge of the second anti-crack projection close to the encapsulation layer in the second area is greater than that in the first area.

The first anti-crack projection may have a curved shape, and a distance between the first bending portion and the display area may be greater than a distance between the first flat portion and the display area.

The display apparatus may further include a cover layer covering the first anti-crack projection and the second anti-crack projection and extending in a direction in which the first anti-crack projection and the second anti-crack projection extend.

A width of a portion of the cover layer covering the first bending portion and the second bending portion may be greater than a width of a portion of the cover layer covering the first flat portion and the second flat portion.

The cover layer may have a convex portion that is convex toward the display area to correspond to the second bending portion.

The bending axis may include a first bending axis and a second bending axis that are different, and the bending area includes a first bending area and a second bending area that are different.

According to an exemplary embodiment of the inventive concept, a display apparatus may include a substrate including a display area where display devices are disposed, a peripheral area outside the display area, and a bending area bendable along a bending axis, and a first anti-crack projection disposed in the peripheral area of the substrate and extending along at least a part of an edge of the substrate. The first anti-crack projection is disposed between the display area and the edge of the substrate, a portion of the first anti-crack projection in the bending area is a bending portion, a preset area including the bending portion on the substrate is a first area, a preset area of the substrate disposed outside the first area, having substantially the same area as that of the first area, and including a part of the first anti-crack projection is a second area, and a portion of the first anti-crack projection belonging to the second area is a flat portion. An edge of the bending portion closest to the display area is a first bending edge, an edge of the flat portion closest to the display area is a first flat edge, and a distance between the first bending edge and the display area is less than a distance between the first flat edge and the display area.

The area occupied by the bending portion in the first area may be greater than the area occupied by the flat portion in the second area.

The display apparatus may further including a wiring disposed in the peripheral area of the substrate between the first anti-crack projection and the display area, and extending along at least a part of the edge of the substrate. A distance between an edge of the wiring closest to the first bending edge and the first bending edge is substantially the same as a distance between an edge of the wiring closest to the first flat edge and the first flat edge.

The display apparatus may further include an encapsulation layer covering the wiring and extending along at least a part of the edge of the substrate. A distance between an edge of the encapsulation layer closest to the first bending edge and the first bending edge is less than a distance between an edge of the encapsulation layer closest to the first flat edge and the first flat edge.

The display apparatus may further include a second anti-crack projection disposed in the peripheral area of the substrate, and extending along at least a part of an edge of the substrate and substantially in parallel with the first anti-crack projection.

The second anti-crack projection may have a constant width, and the second anti-crack projection is disposed between the first anti-crack projection and the edge of the substrate.

The second anti-crack projection may have a constant width, and the second anti-crack projection is disposed between the display area and the first anti-crack projection.

BRIEF DESCRIPTION OF THE DRAWINGS

The above and other features of the inventive concept will become apparent and more readily appreciated by describing in detail exemplary embodiments thereof with reference to the accompanying drawings.

DETAILED DESCRIPTION OF THE EMBODIMENTS

Figure 1:
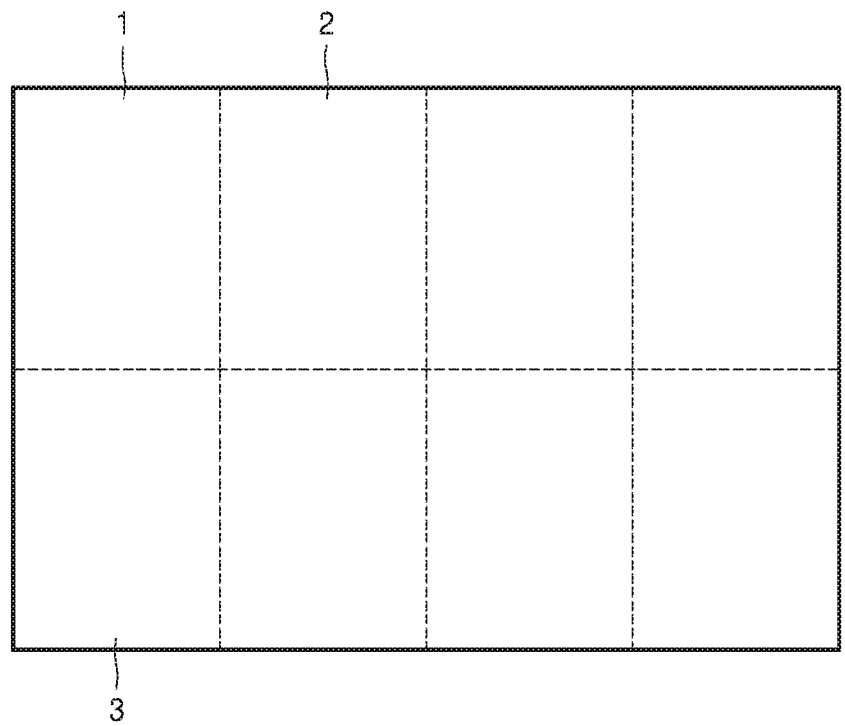
FIG. 1 is a plan view illustrating a process of manufacturing a display apparatus according to an exemplary embodiment of the inventive concept.

Exemplary embodiments of the inventive concept provide a display apparatus for preventing or minimizing defects in a manufacturing process.

Exemplary embodiments of the inventive concept will be described more fully hereinafter with reference to the accompanying drawings Like reference numerals may refer to like elements throughout this application.

It will be understood that when a layer, a film, a region, or a plate is referred to as being "formed on" another layer, film, region, or plate, it may be directly or indirectly formed on the other layer, film, region, or plate. For example, intervening layers, films, regions, or plates may be present. Sizes of elements may be exaggerated for convenience of explanation. In other words, since sizes and thicknesses of elements in the drawings are arbitrarily illustrated for convenience of explanation, the inventive concept is not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view for describing a process of manufacturing a display apparatus, according to an exemplary embodiment of the inventive concept. As shown in FIG. 1, a plurality of display apparatuses are simultaneously manufactured during a manufacturing process. For example, a plurality of display apparatuses 1, 2, and 3 are obtained by forming a plurality of display units on one large mother substrate and cutting the large mother substrate.

Figure 2:
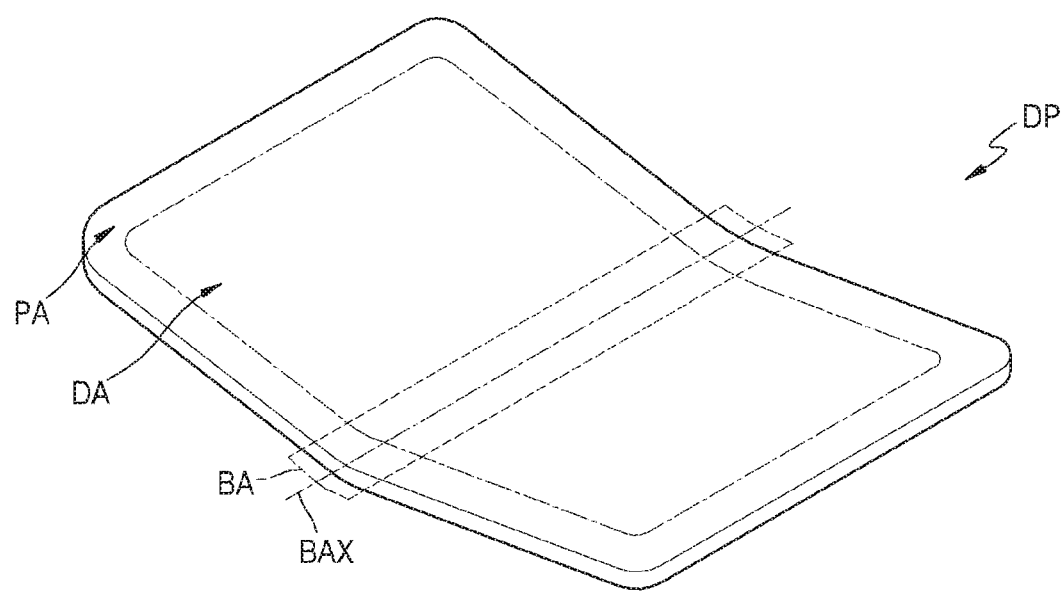
FIG. 2 is a perspective view illustrating an example where a display apparatus manufactured using the process of FIG. 1 is bent according to an exemplary embodiment of the inventive concept.

FIG. 2 is a perspective view illustrating an example where a display apparatus manufactured using the process of FIG. 1 is bent according to an exemplary embodiment of the inventive concept. As shown in FIG. 2, a display apparatus DP according to the present exemplary embodiment may be bent along a bending axis BAX. However, the display apparatus DP is not limited to a display apparatus that may be bent only once. For example, a display apparatus that may be expanded substantially flat after being bent, and further a display apparatus that may be bent a plurality of times are in the scope of the inventive concept. This also applies to the following exemplary embodiments and modified examples thereof.

The display apparatus DP includes a display area DA where display devices are disposed and a peripheral area PA outside the display area DA. An area where bending occurs or may occur along the bending axis BAX may be referred to as a bending area BA. The bending area BA includes a part of the display area DA and a part of the peripheral area PA.

Figure 3:
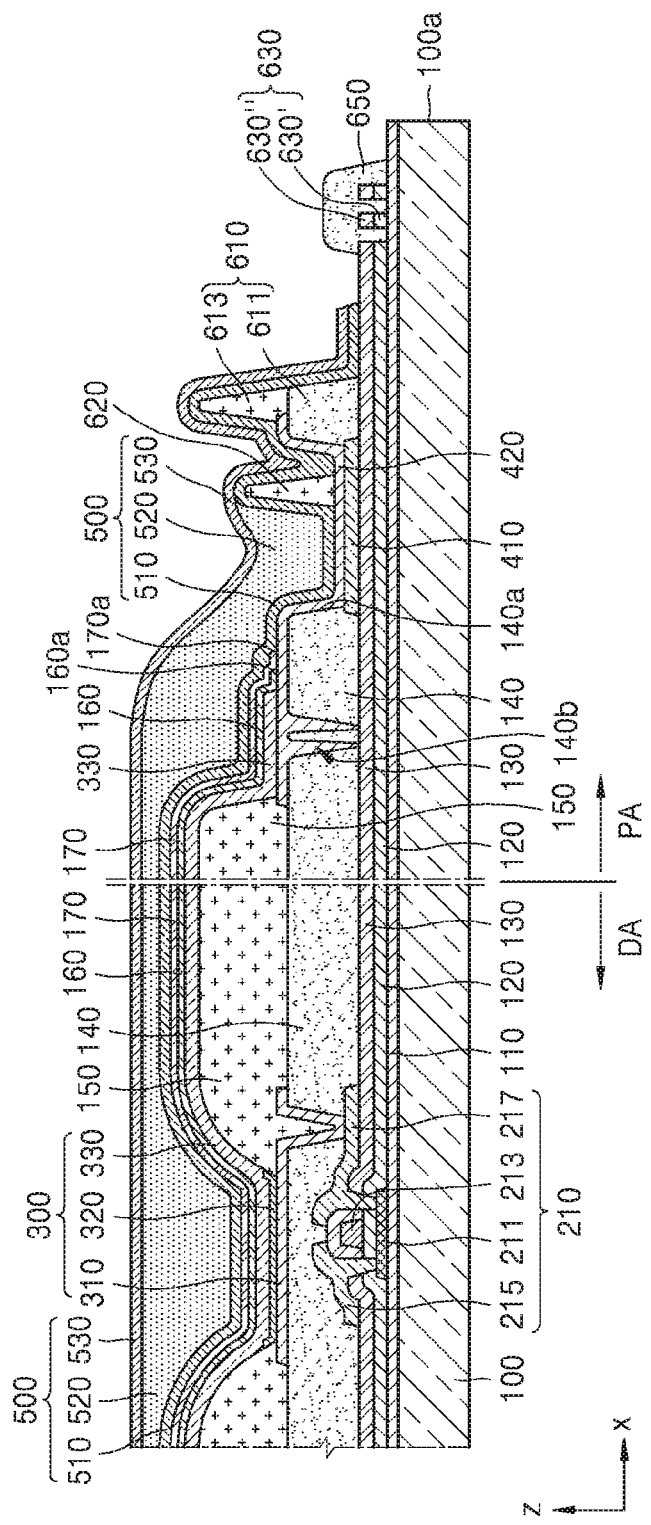
FIG. 3 is a cross-sectional view illustrating a part of the display apparatus of FIG. 2 according to an exemplary embodiment of the inventive concept.

FIG. 3 is a cross-sectional view illustrating a part of the display apparatus of FIG. 2. FIG. 3 illustrates an organic light-emitting display apparatus including an organic light-emitting device 300 as a display device. However, the inventive concept is not limited thereto, and various display apparatuses such as a liquid crystal display apparatus including a liquid crystal device as a display device are also in the scope of the inventive concept. This also applies to the following exemplary embodiments and modified examples thereof. For convenience of explanation, an organic light-emitting display apparatus including an organic light-emitting device as a display device will now be described.

The display apparatus according to the present exemplary embodiment includes various elements including a substrate 100. The substrate 100 includes the display area DA where display devices are disposed and the peripheral area PA outside the display area DA. Since the display apparatus according to the present exemplary embodiment is a display apparatus that is bent or may be bent along the bending axis BAX as shown in FIG. 2, the substrate 100 may be flexible. The substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). However, various modifications may be made. For example, the substrate 100 may include a metal.

A thin-film transistor (TFT) 210 is disposed in the display area DA of the substrate 100, and a display device electrically connected to the TFT 210 is also disposed in the display area DA. FIG. 3 illustrates the organic light-emitting device 300 as a display device. When the organic light-emitting device 300 is electrically connected to the TFT 210, it may mean that a pixel electrode 310 included in the organic light-emitting device 300 is electrically connected to the TFT 210. A TFT may also be disposed in the peripheral area PA of the substrate 100. The TFT disposed in the peripheral area PA may be a part of a circuit unit for controlling an electrical signal applied into the display area DA.

The TFT 210 includes a semiconductor layer 211 including amorphous silicon, polycrystalline silicon, or an organic semiconductor material, a gate electrode 213, a source electrode 215, and a drain electrode 217. To planarize a surface of the substrate 100 or prevent penetration of impurities into the semiconductor layer 211 of the TFT 210, a buffer layer 110 formed of an inorganic material such as silicon oxide, silicon nitride, or silicon oxynitride may be disposed on the substrate 100 and the semiconductor layer 211 of the TFT 210 may be disposed on the buffer layer 110.

The gate electrode 213 of the TFT 210 is disposed over the semiconductor layer 211 of the TFT 210, and the source electrode 215 and the drain electrode 217 of the TFT 210 are electrically connected to each other according to a signal applied to the gate electrode 213 of the TFT 210. The gate electrode 213 of the TFT 210 may include at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), and may have a single or multi-layer structure. To ensure insulation between the semiconductor layer 211 and the gate electrode 213, a gate insulating layer 120 formed of an inorganic material such as silicon oxide, silicon nitride, or silicon oxynitride may be disposed between the semiconductor layer 211 and the gate electrode 213.

An interlayer insulating layer 130 may be disposed on the gate electrode 213, and may have a single or multi-layer structure formed of an inorganic material such as silicon oxide, silicon nitride, or silicon oxynitride.

The source electrode 215 and the drain electrode 217 are disposed on the interlayer insulating layer 130. The source electrode 215 and the drain electrode 217 are electrically connected to the semiconductor layer 211 through contact holes formed in the interlayer insulating layer 130 and the gate insulating layer 120. Each of the source electrode 215 and the drain electrode 217 may include at least one of Al, Pt, Pd, Ag, Mg, Au, Ni, Nd, Ir, Cr, Li, Ca, Mo, Ti, W, or Cu, and may have a single or multi-layer structure.

To protect the TFT 210, etc. constructed as described, a protective film covering the TFT 210 may be provided. The protective film may be formed of an inorganic material such as silicon oxide, silicon nitride, or silicon oxynitride. The protective film may have a single or multi-layer structure.

A planarization layer 140 may be disposed on the protective film. For example, since the organic light-emitting device 300 is disposed on the TFT 210 as shown in FIG. 3, the planarization layer 140 may substantially planarize a top surface of the protective film covering the TFT 210. The planarization layer 140 may include an organic material such as acryl, benzocyclobutene (BCB), or hexamethyldisiloxane (HMDSO). Although the planarization layer 140 is a single layer in FIG. 3, various modifications may be made. For example, the planarization layer 140 may have a multi-layer structure.

The display apparatus according to the present exemplary embodiment may include both the protective film and the planarization layer 140, or if necessary, may include only the planarization layer 140.

In the display area DA of the substrate 100, the organic light-emitting device 300, including the pixel electrode 310, a counter electrode 330, and an intermediate layer 320 including an emission layer and disposed between the pixel electrode 310 and the counter electrode 330, is disposed on the planarization layer 140.

An opening through which at least one of the source electrode 215 and the drain electrode 217 of the TFT 210 is exposed is formed in the planarization layer 140, and the pixel electrode 310 electrically connected to the TFT 210 by contacting one of the source electrode 215 and the drain electrode 217 through the opening is disposed on the planarization layer 140. The pixel electrode 310 may be a (semi)transparent electrode or a reflective electrode. When the pixel electrode 310 is a (semi)transparent electrode, the pixel electrode 310 may include, for example, ITO, IZO, ZnO, $In_2O_3$, IGO, or AZO. When the pixel electrode 310 is a reflective electrode, the pixel electrode 310 may include a reflective film formed of Ag, Mg, Al, Pt, Pd, Au, Ni, Nd, Ir, Cr, or a compound thereof, and a layer formed of ITO, IZO, ZnO, $In_2O_3$, IGO, or AZO. However, the inventive concept is not limited thereto and various modifications may be made. For example, the pixel electrode 310 may include various materials and may have a single or multi-layer structure.

A pixel-defining film 150 may be disposed on the planarization layer 140. The pixel-defining film 150 defines a pixel by having an opening corresponding to each sub-pixel, e.g., an opening through which at least a central portion of the pixel electrode 310 is exposed. Additionally, in FIG. 3, the pixel-defining film 150 may prevent an arc or the like from occurring at an edge of the pixel electrode 310 by increasing a distance between the edge of the pixel electrode 310 and the counter electrode 330 disposed over the pixel electrode 310. The pixel-defining film 150 may include an organic material such as PI or HMDSO.

The intermediate layer 320 of the organic light-emitting device 300 may include a low molecular or high molecular weight material. When the intermediate layer 320 includes a low molecular weight material, the intermediate layer 320 have a structure in which a hole injection layer (HIL), a hole transport layer (HTL), an emission layer (EML), an electron transport layer (ETL), and/or an electron injection layer (EIL) are stacked, and may include any of various organic materials such as copper phthalocyanine (CuPc), N,N'-Di (naphthalene-1-yl)-N,N'-diphenyl-benzidine (NPB), or tris-8-hydroxyquinoline aluminum ($Alq_3$). The above layers may be formed by using vacuum deposition.

When the intermediate layer 320 includes a high molecular weight material, the intermediate layer 320 may have a structure including, for example, an HTL and an EML. In this case, the HTL may include poly(3,4-ethylenedioxythiophene) (PEDOT), and the EML may include a polymer material such as a polyphenylene vinylene (PPV)-based material or a polyfluorene-based material. The intermediate layer 320 may be formed by using screen printing, inkjet printing, or laser-induced thermal imaging (LITI).

However, the intermediate layer 320 is not limited thereto and may have any of various structures.

The counter electrode 330 may be disposed in the display area DA, to cover the display area DA as shown in FIG. 3. For example, the counter electrode 330 may be integrally formed in a plurality of the organic light-emitting devices 300 and may correspond to a plurality of the pixel electrodes 310. The counter electrode 330 may be a (semi)transparent electrode or a reflective electrode. When the counter electrode 330 is a (semi)transparent electrode, the counter electrode 330 may include a layer formed of a metal having a low work function such as Li, Ca, LiF/Ca, LiF/Al, Al, Ag, Mg, or a compound thereof, and a (semi)transparent conductive layer formed of ITO, IZO, ZnO, or $In_2O_3$. When the counter electrode 330 is a reflective electrode, the counter electrode 330 may include a layer formed of Li, Ca, LiF/Ca, LiF/Al, Al, Ag, Mg, or a compound thereof. However, a configuration and a material of the counter electrode 330 are not limited thereto, and various modifications may be made.

A display device such as the organic light-emitting device 300 includes the counter electrode 330. To display an image, a preset electrical signal is applied to the counter electrode 330. Accordingly, an electrode power supply line 410 is disposed in the peripheral area PA and transmits the preset electrical signal to the counter electrode 330.

When various conductive layers in the display area DA are formed, the electrode power supply line 410 may be formed at substantially the same time as the various conductive layers by using the same material as the various conductive layers. In FIG. 3, as the source electrode 215 and the drain electrode 217 of the TFT 210 are disposed on the interlayer insulating layer 130 in the display area DA, the electrode power supply line 410 is disposed on the interlayer insulating layer 130 in the peripheral area PA. In this case, the source electrode 215 and the drain electrode 217 of the TFT 210 may be formed on the interlayer insulating layer 130 in the display area DA and the electrode power supply line 410 may be formed on the interlayer insulating layer 130, at substantially the same time as the source electrode 215 and the drain electrode 217 of the TFT 210 by using the same material as the source electrode 215 and the drain electrode 217 of the TFT 210. Accordingly, the electrode power supply line 410 has substantially the same structure as that of each of the source electrode 215 and the drain electrode 217. However, the inventive concept is not limited thereto and various modifications may be made. For example, the electrode power supply line 410 may be formed on the gate insulating layer 120 at substantially the same time as the gate electrode 213 by using the same material as the gate electrode 213

The counter electrode 330 may not directly contact the electrode power supply line 410 and may be electrically connected to the electrode power supply line 410 through a protective conductive layer 420, as shown in FIG. 3. For example, the protective conductive layer 420 disposed on the planarization layer 140 may extend to the electrode power supply line 410 and may be electrically connected to the electrode power supply line 410. Accordingly, the counter electrode 330 may contact the protective conductive layer 420 in the peripheral area PA, and the protective conductive layer 420 may contact the electrode power supply line 410 in the peripheral area PA.

The protective conductive layer 420 is disposed on the planarization layer 140 as shown in FIG. 3. Accordingly, the protective conductive layer 420 may be formed at substantially the same time as an element disposed on the planarization layer 140 in the display area DA by using the same material as the element. In detail, the protective conductive layer 420 may be formed on the planarization layer 140 in the peripheral area PA at substantially the same time as the pixel electrode 310 formed on the planarization layer 140 in the display area DA by using the same material as the pixel electrode 310. Accordingly, the protective conductive layer 420 and the pixel electrode 310 may have substantially the same structure. The protective conductive layer 420 may cover a portion of the electrode power supply line 410 that is exposed by not being covered by the planarization layer 140 as shown in FIG. 3. As a result, as described below, damage to the electrode power supply line 410 may be prevented in a process of forming a first limiting dam 610 or a second limiting dam 620.

To prevent penetration of external impurities such as oxygen or moisture into the display area DA through the planarization layer 140, the planarization layer 140 may have an opening 140b in the peripheral area PA as shown in FIG. 3. In addition, when the protective conductive layer 420 is formed, the protective conductive layer 420 may fill the opening 140b of the planarization layer 140. Accordingly, impurities penetrating into the planarization layer 140 in the peripheral area PA may be effectively prevented from penetrating into the planarization layer 140 in the display area DA.

A capping layer 160 for improving efficiency of light generated by the organic light-emitting device 300 is disposed on the counter electrode 330. The capping layer 160 may cover the counter electrode 330 and may extend to the outside of the counter electrode 330 and may contact the protective conductive layer 420 disposed under the counter electrode 330. Since the counter electrode 330 covers the display area DA and extends to the outside of the display area DA, the capping layer 160 covers the display area DA and extends to the peripheral area PA outside the display area DA. The capping layer 160 includes an organic material.

As described above, the capping layer 160 improves the efficiency of light generated by the organic light-emitting device 300. For example, the capping layer 160 may improve light extraction efficiency. To uniformly improve efficiency in the display area DA, the capping layer 160 may have a top surface corresponding to a curvature of a top surface of a layer disposed under the capping layer 160. For example, as shown in FIG. 3, a top surface of a portion of the capping layer 160 disposed on the counter electrode 330 may have a shape corresponding to a curvature of a top surface of the counter electrode 330.

An encapsulation layer 500 is disposed on the capping layer 160. The encapsulation layer 500 may protect the organic light-emitting device 300 from external moisture or oxygen. To this end, the encapsulation layer 500 extends to be disposed not only in the display area DA where the organic light-emitting device 300 is disposed but also in the peripheral area PA outside the display area DA. The encapsulation layer 500 may have a multi-layer structure as shown in FIG. 3. In detail, the encapsulation layer 500 may include a first inorganic encapsulation layer 510, an organic encapsulation layer 520, and a second inorganic encapsulation layer 530.

The first inorganic encapsulation layer 510 may cover the capping layer 160 and may include silicon oxide, silicon nitride, and/or silicon oxynitride. Since the first inorganic encapsulation layer 510 is formed along a structure disposed under the first inorganic encapsulation layer 510, a top surface of the first inorganic encapsulation layer 510 may not be flat as shown in FIG. 3. Since the organic encapsulation layer 520 covers the first inorganic encapsulation layer 510 and has a sufficient thickness, a top surface of the organic encapsulation layer 520 may be substantially flat over the entire display area DA. The organic encapsulation layer 520 may include at least one material selected from the group consisting of PET, PEN, PC, PI, polyethylene sulfonate, polyoxymethylene, polyarylate, and HMDSO. The second inorganic encapsulation layer 530 may cover the organic encapsulation layer 520 and may include silicon oxide, silicon nitride, and/or silicon oxynitride. The second inorganic encapsulation layer 530 may extend to the outside of the organic encapsulation layer 520 and may contact the first inorganic encapsulation layer 510 to prevent the organic encapsulation layer 520 from being exposed to the outside.

As such, since the encapsulation layer 500 includes the first inorganic encapsulation layer 510, the organic encapsulation layer 520, and the second inorganic encapsulation layer 530, even when cracks occur in the encapsulation layer 500 through such a multi-layer structure, the cracks may not be connected between the first inorganic encapsulation layer 510 and the organic encapsulation layer 520 or between the organic encapsulation layer 520 and the second inorganic encapsulation layer 530. Accordingly, the risk of forming a path through which external moisture or oxygen penetrates into the display area DA may be prevented or minimized.

When the encapsulation layer 500 is formed, structures disposed under the encapsulation layer 500 may be damaged. For example, the first inorganic encapsulation layer 510 may be formed by using chemical vapor deposition. When the first inorganic encapsulation layer 510 is formed by using chemical vapor deposition, a layer directly disposed under the first inorganic encapsulation layer 510 may be damaged. Accordingly, when the first inorganic encapsulation layer 510 is directly formed on the capping layer 160, the capping layer 160 for improving efficiency of light generated by the organic light-emitting device 300 may be damaged, thus reducing light efficiency of the display apparatus. Accordingly, to prevent damage to the capping layer 160 when the encapsulation layer 500 is formed, a protective layer 170 is disposed between the capping layer 160 and the encapsulation layer 500. The protective layer 170 may include LiF.

As described above, the capping layer 160 extends to be disposed not only in the display area DA but also in the peripheral area PA outside the display area DA. Accordingly, the protective layer 170 may extend to the outside of the capping layer 160 so that the capping layer 160 and the encapsulation layer 500 do not directly contact each other. In this case, the protective layer 170 covers a terminal end 160a of the capping layer 160, and a terminal end 170a of the protective layer 170 is disposed on the planarization layer 140. In detail, as shown in FIG. 3, the terminal end 170a of the protective layer 170 directly contacts a portion of the protective conductive layer 420 disposed on the planarization layer 140.

The first inorganic encapsulation layer 510 that is a lowermost layer of the encapsulation layer 500 has greater adhesive strength to a layer formed of an inorganic material than to a layer formed of an organic material. Since the capping layer 160 is formed of an organic material as described above, adhesive strength between the protective layer 170 formed of an inorganic material such as LiF and the first inorganic encapsulation layer 510 is greater than adhesive strength between the capping layer 160 and the first inorganic encapsulation layer 510. Accordingly, in the display apparatus according to the present exemplary embodiment, since adhesive strength between the encapsulation layer 500 and a layer disposed under the encapsulation layer 500 is maintained at a high level, peeling of the encapsulation layer 500 from the layer disposed under the encapsulation layer 500 may be effectively prevented or minimized during a manufacturing process or during use after the manufacturing process.

When the encapsulation layer 500 is formed, specifically, when the organic encapsulation layer 520 is formed, it may be necessary to define a material for forming the organic encapsulation layer 520 within a preset area. To this end, the first limiting dam 610 may be disposed in the peripheral area PA as shown in FIG. 3. In detail, the planarization layer 140 as well as the buffer layer 110, the gate insulating layer 120, and the interlayer insulating layer 130 may be not only in the display area DA but also in the peripheral area PA of the substrate 100 as shown in FIG. 3. The first limiting dam 610 is disposed in the peripheral area PA to be spaced apart from the planarization layer 140.

The first limiting dam 610 may have a multi-layer structure. For example, the first limiting dam 610 may include a first layer 611 and a second layer 613 sequentially disposed away from the substrate 100. The first layer 611 may be formed at substantially the same time as the planarization layer 140 of the display area DA by using the same material as the planarization layer 140, and the second layer 613 may be formed at substantially the same time as the pixel-defining film 150 of the display area DA by using the same material as the pixel-defining film 150.

As shown in FIG. 3, the second limiting dam 620 may be provided between the first limiting dam 610 and the planarization layer 140, in addition to the first limiting dam 610. The second limiting dam 620 may be disposed on a portion of the protective conductive layer 420 disposed on the electrode power supply line 410. The second limiting dam 620 is also spaced apart from the planarization layer 140 and is disposed in the peripheral area PA. The second limiting dam 620 may have a multi-layer structure, like the first limiting dam 610, and may include fewer layers than the first limiting dam 610 so that a height of the second limiting dam 620 from the substrate 100 is less than that of the first limiting dam 610. In FIG. 3, the second limiting dam 620 is formed at substantially the same time as the second layer 613 of the first limiting dam 610 by using the same material as the second layer 613.

The first inorganic encapsulation layer 510 of the encapsulation layer 500 formed through chemical vapor deposition covers the second limiting dam 620 and the first limiting dam 610, and extends to the outside of the first limiting dam 610 as shown in FIG. 3. A position of the organic encapsulation layer 520 on the first inorganic encapsulation layer 510 may be defined by the second limiting dam 620, to prevent a material for forming the organic encapsulation layer 520 from overflowing to the outside of the second limiting dam 620 in a forming process. Even when the material for forming the organic encapsulation layer 520 partially flows to the outside of the second limiting dam 620, since the position is defined by the first limiting dam 610, the material for forming the organic encapsulation layer 520 may be prevented from flowing to an edge of the substrate 100.

An anti-crack projection 630 is disposed in the peripheral area PA as shown in FIG. 3. The anti-crack projection 630 may extend along at least a part of an edge 100a of the substrate 100. For example, the anti-crack projection 630 may have a shape extending around the display area DA. However, the anti-crack projection 630 may be discontinuous in some areas.

The anti-crack projection 630 may have any of various shapes, and may be formed at substantially the same time as some elements formed in the display area DA by using the same material as the some elements as shown in FIG. 3, and may have a multi-layer structure. In FIG. 3, the anti-crack projection 630 has a multi-layer structure including a lower layer 630' and an upper layer 630" disposed on the lower layer 630'. In detail, the anti-crack projection 630 includes the lower layer 630' including the same material as that of the gate insulating layer 120 and the upper layer 630" including the same material as that of the interlayer insulating layer 130 disposed on the gate insulating layer 120. The anti-crack projection 630 may be disposed on the buffer layer 110. If necessary, the anti-crack projection 630 may be disposed on a layer disposed under the buffer layer 110, and may include a layer including the same material as that of the buffer layer 110.

As shown in FIG. 3, a plurality of the anti-crack projections 630, instead of one anti-crack projection 630, may be provided to be spaced apart from one another. In this case, unlike in FIG. 3, the plurality of anti-crack projections 630 may be connected to one another. For example, the upper layers 630" of adjacent anti-crack projections 630 may be spaced apart from each other and the lower layers 630' of adjacent anti-crack projections 630 may be connected to each other. The anti-crack projection 630 may be disposed on the buffer layer 110 as shown in FIG. 3. In this structure, when both the buffer layer 110 and the anti-crack projection 630 are formed of an inorganic material, the anti-crack projection 630 may be understood as a part of a multi-layer structure formed of an inorganic material and having a groove. However, various modifications may be made. For example, the anti-crack projection 630 may be formed by forming a groove in a single layer formed of an inorganic material. The modifications may also apply to the following exemplary embodiments and modified examples thereof.

The anti-crack projection 630 may be covered by a cover layer 650 as shown in FIG. 3. The cover layer 650 may be formed at substantially the same time as the interlayer insulating layer 130 formed in the display area DA by using the same material as the interlayer insulating layer 130. For example, the cover layer 650 may be a layer formed of an organic material and covering the anti-crack projection 630 including an inorganic material. The cover layer 650 may cover a terminal end of the interlayer insulating layer 130 and/or the gate insulating layer 120 at the edge 100a of the substrate 100, and may cover the anti-crack projection 630.

Figure 4:
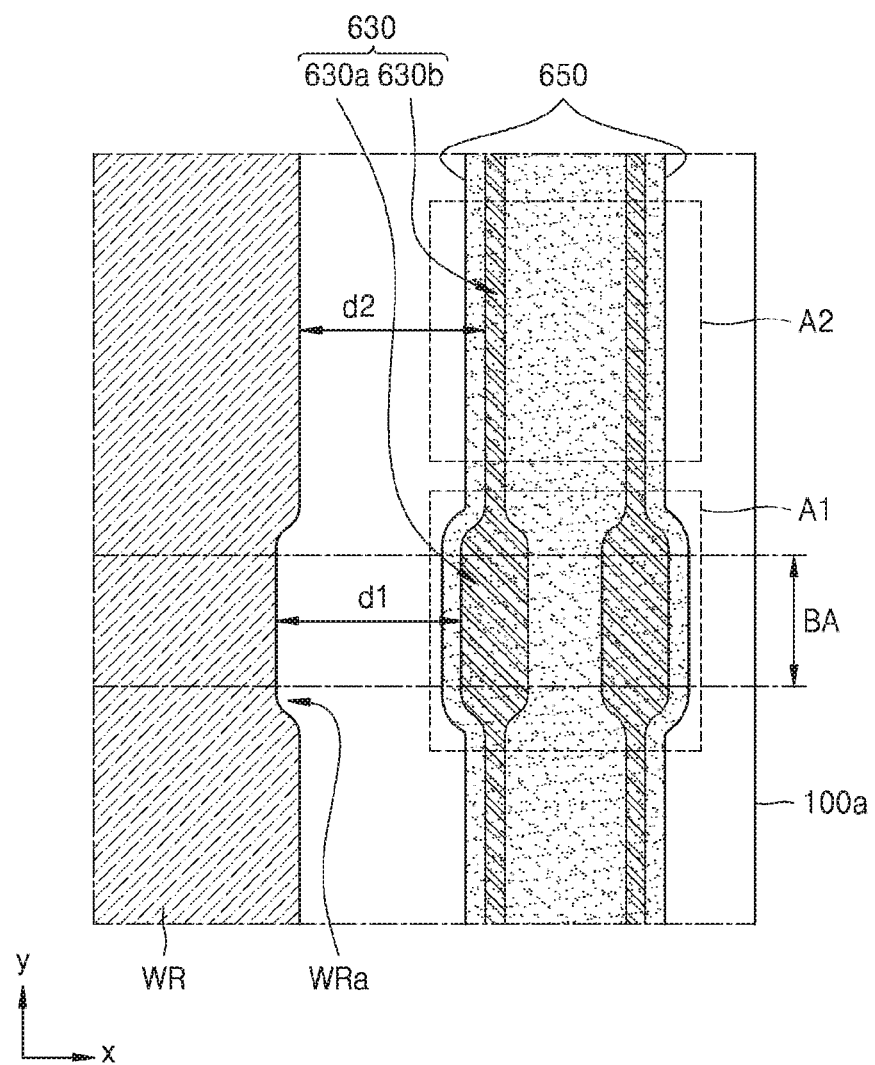
FIGS. 4-17 are plan views illustrating a part of the display apparatus of FIG. 3 according to exemplary embodiments of the inventive concept.

FIG. 4 is a plan view illustrating a part of the display apparatus of FIG. 3 according to an exemplary embodiment of the inventive concept. In detail, FIG. 4 is a plan view illustrating the anti-crack projection 630 and a vicinity of the anti-crack projection 630 of the display apparatus of FIG. 3, in particular, illustrating a part of the display apparatus including the bending area BA through which the bending axis BAX (see FIG. 2) passes.

The anti-crack projection 630 extends along the edge 100a of the substrate 100. The anti-crack projection 630 is disposed between the display area DA and the edge 100a of the substrate 100. A portion of the anti-crack projection 630 passes through the bending area BA and another portion of the anti-crack projection 630 is disposed outside the bending area BA. Accordingly, the portion of the anti-crack projection 630 in the bending area BA may be referred to as a bending portion 630a. In this case, a preset area including the bending portion 630a of the anti-crack projection 630 on the substrate 100 as shown in FIG. 3 may be referred to as a first area A1. Various modifications may be made. For example, a part of the first area A1 may extend to the outside of the bending area BA as shown in FIG. 4, or an edge of the first area A1 may be aligned with an edge of the bending area BA (in a +y direction and a −y direction).

A second area A2 is a preset area of the substrate 100 disposed outside the first area A1 and has substantially the same area as that of the first area A1. In this case, a portion of the anti-crack projection 630 included in the second area A2 does not belong to the bending area BA. Accordingly, when a portion of the anti-crack projection 630 belonging to the second area A2 is a flat portion 630b, the flat portion 630b does not belong to the bending area BA.

In the display apparatus according to the present exemplary embodiment, the area occupied by the bending portion 630a of the anti-crack projection 630 in the first area A1 is greater than the area occupied by the flat portion 630b of the anti-crack projection 630 in the second area A2. To this end, since the areas of the first area A1 and the second area A2 are substantially the same, a width of the bending portion 630a (in an x-axis direction) is greater than that of the flat portion 630b (in the x-axis direction) as shown in FIG. 4.

In other words, an edge of the bending portion 630a closest to the display area DA may be referred to as a first bending edge, and an edge of the flat portion 630b closest to the display area DA may be referred to as a first flat edge. A distance between the first bending edge and the display area DA may be less than a distance between the first flat edge and the display area DA.

The display apparatus according to the present exemplary embodiment may be bent along the bending axis BAX as described above. The display apparatus according to the present exemplary embodiment may be a display apparatus that may be bent only once, a display apparatus that may be expanded substantially flat after being bent, or a display apparatus that may be bent a plurality of times. In any case, stress may be applied to the bending area BA in a bending process, and thus cracks may occur in the bending area BA. In this case, when impurities such as external moisture or oxygen penetrate into the display area DA through the cracks, a display device in the display area DA may be damaged. In particular, in an organic light-emitting display apparatus including the organic light-emitting device 300 as a display device, since the organic light-emitting device 300 is very vulnerable to external impurities, it is necessary to effectively prevent penetration of external impurities through the cracks.

Since the anti-crack projection 630 of the display apparatus according to the present exemplary embodiment has a shape extending along the edge 100a of the substrate 100, a width of the bending portion 630a (in the x-axis direction) that is a portion of the anti-crack projection 630 is greater than a width of the flat portion 630b (in the x-axis direction) that is another portion of the anti-crack projection 630 as described above. Accordingly, even when cracks occur in the bending portion 630a of the anti-crack projection 630 due to stress applied to the bending area BA in a bending process, the risk that the cracks completely pass through the bending portion 630a of the anti-crack projection 630 may be reduced. Accordingly, external impurities may be effectively prevented from penetrating into the display area DA through the anti-crack projection 630.

For reference, a portion of the anti-crack projection 630 in the bending area BA is referred to as the bending portion 630a, and the first area A1 refers to a preset area including the bending portion 630a of the anti-crack projection 630 on the substrate 100. Accordingly, as shown in FIG. 4, a width of a portion of the anti-crack projection 630 belonging to the first area A1 but not belonging to the bending area BA may be substantially the same as a width of the bending portion 630a. This applies to the following exemplary embodiments and modified examples thereof.

The cover layer 650 including an organic material covers the anti-crack projection 630 including an inorganic material as described above. Since the encapsulation layer 500 includes the first inorganic encapsulation layer 510, the organic encapsulation layer 520, and the second inorganic encapsulation layer 530 as described above, even when cracks occur in the encapsulation layer 500 through a multi-layer structure, the cracks may not be connected between the first inorganic encapsulation layer 510 and the organic encapsulation layer 520 or between the organic encapsulation layer 520 and the second inorganic encapsulation layer 530. Likewise, when a plurality of the anti-crack projections 630 including an inorganic material are provided and the cover layer 650 including an organic material covers the anti-crack projections 630 to fill spaces between the anti-crack projections 630, a path from a side surface of the display apparatus to the display area DA of the display apparatus includes an inorganic layer, an organic layer, and an inorganic layer. Accordingly, through such a multi-layer structure, formation of a path through which external moisture or oxygen penetrates into the display area DA may be prevented or minimized. This applies to the following exemplary embodiments and modified examples thereof.

A wiring WR may be disposed in a peripheral area PA of the substrate 100 as shown in FIG. 4. The wiring WR may be a part of the electrode power supply line 410 of FIG. 3, or another wiring. The wiring WR is disposed between the anti-crack projection 630 and the display area DA. A part of the wiring WR may extend into the display area DA. This may apply to the following exemplary embodiments and modified examples thereof. The wiring WR may extend along at least a part of the edge 100a of the substrate 100. In FIG. 4, the wiring WR extends in a y-axis direction.

In this case, a distance between an edge of the wiring WR close to the anti-crack projection 630 (in a +x direction) and an edge of the anti-crack projection 630 close to the wiring WR (in the −x direction) may be substantially the same in the first area A1 and the second area A2. For example, a distance d1 between an edge of the bending portion 630a of the anti-crack projection 630 close to the wiring WR in the first area A1 and an edge of the wiring WR close to the bending portion 630a of the anti-crack projection 630 in the first area A1 may be substantially the same as a distance d2 between an edge of the flat portion 630b of the anti-crack projection 630 close to the wiring WR in the second area A2 and an edge of the wiring WR close to the flat portion 630b of the anti-crack projection 630 in the second area A2. In other words, the distance d1 between an edge of the wiring WR closest to the first bending edge and the first bending edge is substantially the same as the distance d2 between an edge of the wiring WR closest to the first flat edge and the first flat edge.

To this end, the edge of the wiring WR close to the anti-crack projection 630 may have a concave portion WRa recessed inward to correspond to the bending portion 630a of the anti-crack projection 630. Since a space between the wiring WR and the anti-crack projection 630 is substantially maintained constant due to this structure, a tolerance between the wiring WR and the anti-crack projection 630 may be constant during a manufacturing process.

The anti-crack projection 630 may be covered by the cover layer 650 that is an organic layer as described above. The cover layer 650 extends along the edge 100a of the substrate 100 in a direction in which the anti-crack projection 630 extends. For the cover layer 650 to completely cover the anti-crack projection 630, a width of a portion of the cover layer 650 corresponding to the bending portion 630a may be greater than a width of a portion of the cover layer 650 corresponding to the flat portion 630b. Accordingly, the cover layer 650 may include a convex portion that is convex toward the display area DA (see FIG. 3) to correspond to the bending portion 630a of the anti-crack projection 630, and a convex portion that is convex away from the display area DA.

Figure 5:
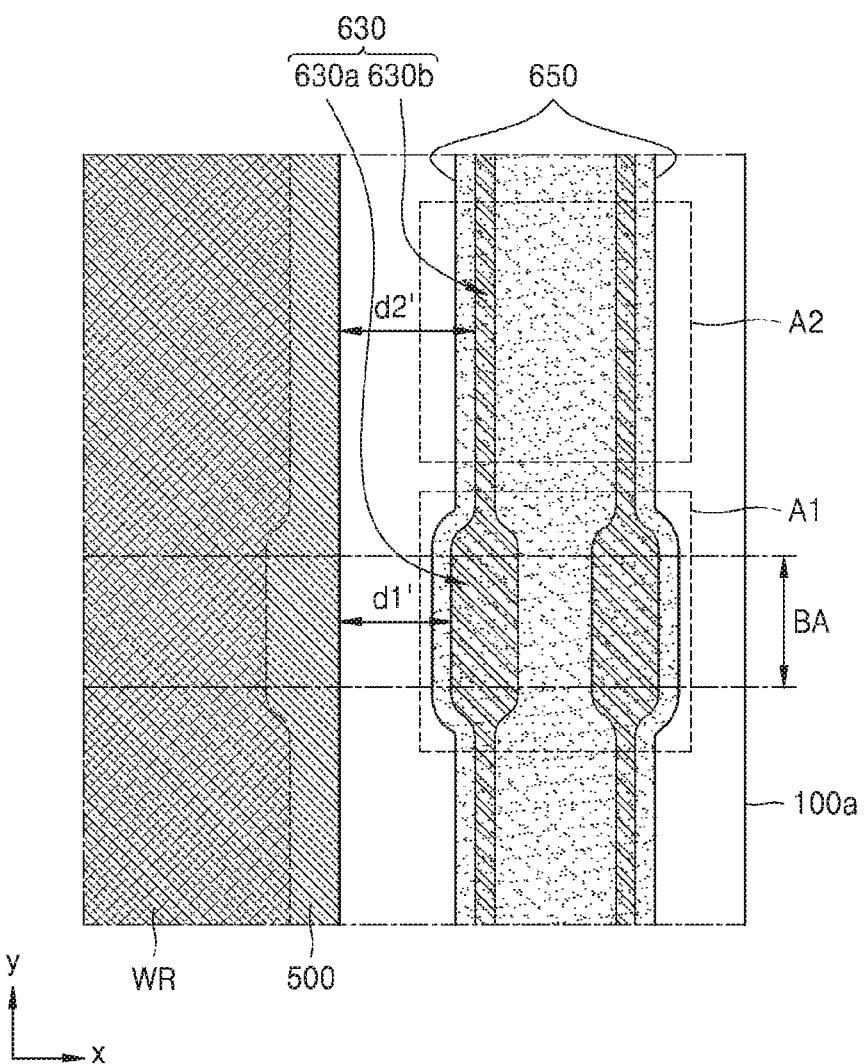

The display apparatus includes the encapsulation layer 500 covering display devices in the display area DA. As shown in FIG. 5 that is a plan view illustrating a part of a display apparatus according to an exemplary embodiment of the inventive concept, a part of the encapsulation layer 500 may extend to a peripheral area along the edge 100a of the substrate 100, and may cover the wiring WR. In particular, the first inorganic encapsulation layer 510 and the second inorganic encapsulation layer 530 of the encapsulation layer 500 may extend to a vicinity of the anti-crack projection 630.

In this case, a distance d1' between an edge of the encapsulation layer 500 close to the anti-crack projection 630 in the first area A1 overlapping the bending area BA and an edge of the anti-crack projection 630 close to the encapsulation layer 500 in the first area A1 may be less than a distance d2' between an edge of the encapsulation layer 500 close to the anti-crack projection 630 in the second area A2 outside the bending area BA and an edge of the anti-crack projection 630 close to the encapsulation layer 500 in the second area A2. In other words, the distance d1' between an edge of the encapsulation layer 500 closest to the first bending edge and the first bending edge is less than the distance d2' between an edge of the encapsulation layer 500 closest to the first flat edge and the first flat edge.

This is because an outer edge of the encapsulation layer 500 does not have a concave portion and has a substantially linear shape.

The display apparatus according to the present exemplary embodiment may include the plurality of anti-crack projections 630. In this case, as shown in FIGS. 4 and 5, the anti-crack projections 630 that are disposed substantially parallel to one another may have substantially the same shape or similar shapes. However, the inventive concept is not limited thereto.

Figure 6:
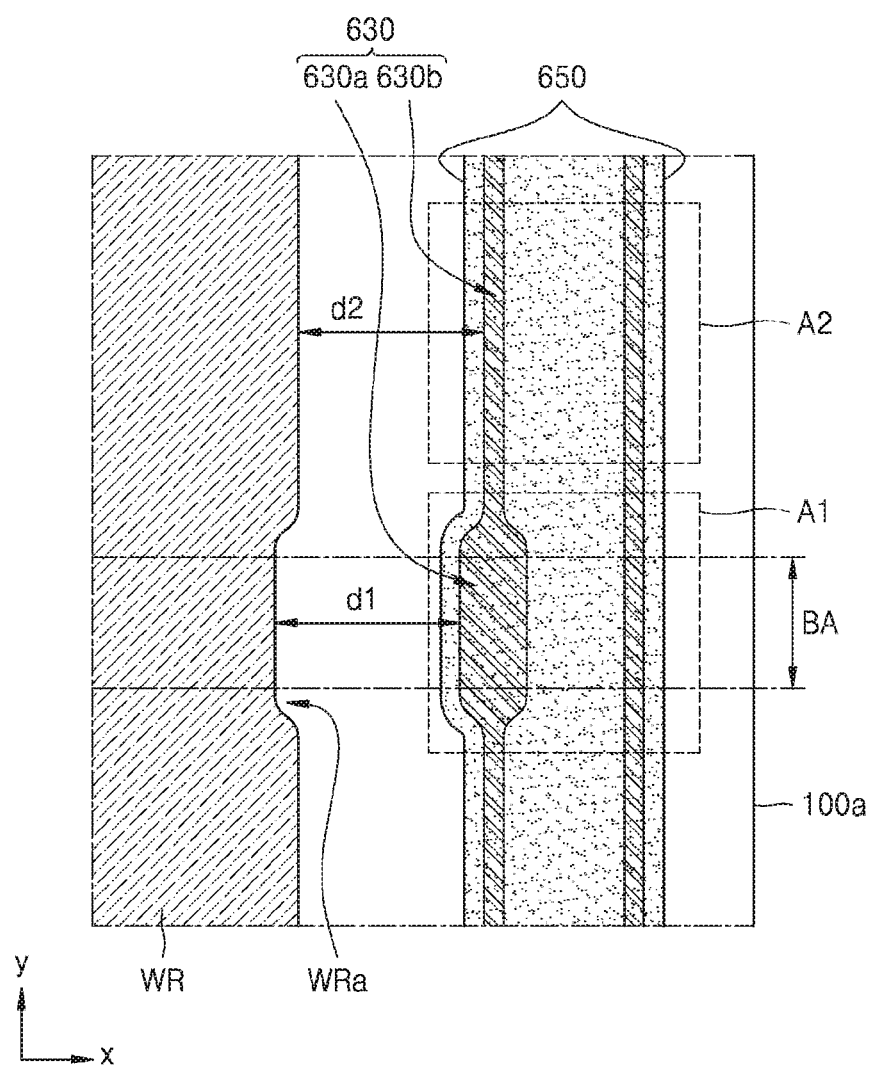

For example, as shown in FIG. 6 that is a plan view illustrating a part of a display apparatus according to an exemplary embodiment of the inventive concept, the anti-crack projection 630 disposed relatively adjacent to the display area DA includes the bending portion 630a and the flat portion 630b as described above, whereas a width of the anti-crack projection 630 disposed relatively adjacent to the edge 100a of the substrate 100 may be constant in the bending area BA and an area outside the bending area BA. In other words, the anti-crack projection 630 disposed relatively adjacent to the edge 100a of the substrate 100 may have a linear shape, which is different from the anti-crack projection 630 disposed relatively adjacent to the display area DA.

Here, the anti-crack projection 630 disposed relatively adjacent to the display area DA may be referred to as a first anti-crack projection, and the anti-crack projection 630 disposed relatively adjacent to the edge 100a of the substrate 100 may be referred to as a second anti-crack projection. The second anti-crack projection having a constant width (e.g., a linear shape) is disposed between the first anti-crack projection and the edge 100a of the substrate 100.

In this case, an edge of the cover layer 650 close to the edge 100a of the substrate 100 may have a linear shape, without being curved in the first area A1 and the second area A2. An edge of the cover layer 650 close to the display area DA may have a shape projecting toward the display area DA in a portion corresponding to the bending area BA.

Figure 7:
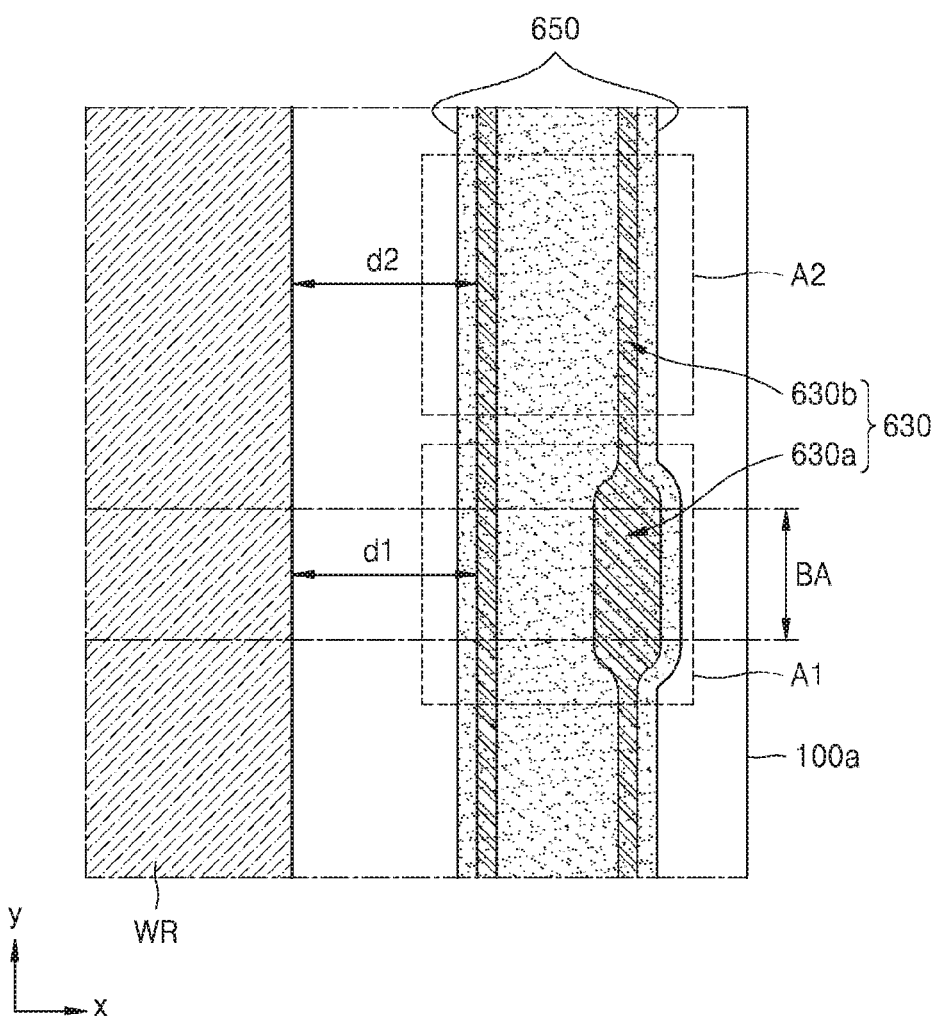

As shown in FIG. 7 that is a plan view illustrating a part of a display apparatus according to an exemplary embodiment of the inventive concept, a width of the anti-crack projection 630 disposed relatively adjacent to the display area DA may be constant in the bending area BA and an area outside the bending area BA. The anti-crack projection 630 disposed relatively adjacent to the edge 100a of the substrate 100 may include the bending portion 630a and the flat portion 630b as described with reference to FIG. 4.

Here, the anti-crack projection 630 disposed relatively adjacent to the edge 100a of the substrate 100 may be referred to as a first anti-crack projection, and the anti-crack projection 630 disposed relatively adjacent to the display area DA may be referred to as a second anti-crack projection. The second anti-crack projection having a constant width (e.g., a linear shape) is disposed between the display area DA and the first anti-crack projection.

In this case, an edge of the cover layer 650 close to the display area DA may have a linear shape, without being curved in the first area A1 and the second area A2. An edge of the cover layer 650 close to the edge 100a of the substrate 100 may have a shape projecting toward the edge 100a of the substrate 100 in a portion corresponding to the bending area BA.

Figure 8:
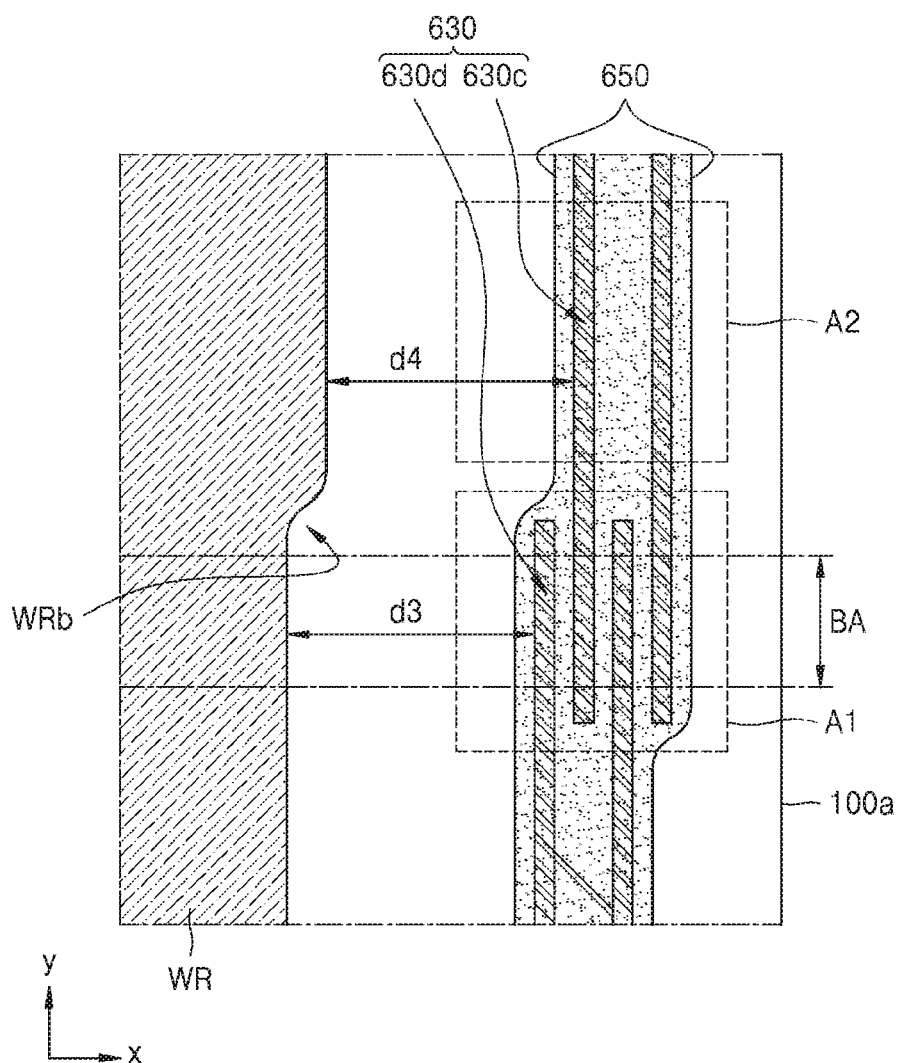

FIG. 8 is a plan view illustrating a part of a display apparatus according to an exemplary embodiment of the inventive concept. A shape of the anti-crack projection 630 in the display apparatus according to the present exemplary embodiment is different from a shape of the anti-crack projection 630 in any of the display apparatuses according to the above-described exemplary embodiments. In detail, the anti-crack projection 630 included in the display apparatus according to the present exemplary embodiment includes a first projection 630c extending into the first area A1 from one side of the first area A1 (in the +y direction) including the bending area BA, and a second projection 630d extending into the first area A1 from another side of the first area A1 (in the −y direction). In this case, the second projection 630d in the first area A1 is disposed closer to the display area DA than the first projection 630c, and a bending portion that is a portion of the anti-crack projection 630 in the bending area BA includes a part of the first projection 630c and a part of the second projection 630d.

The anti-crack projection 630 of the display apparatus according to the present exemplary embodiment has a shape extending along the edge 100a of the substrate 100, and the bending portion that is a portion of the anti-crack projection 630 in the bending area BA includes a part of the first projection 630c and a part of the second projection 630d as described above. Accordingly, even when cracks occur in any one of the first projection 630c and the second projection 630d of the bending area BA due to stress applied to the bending area BA in a bending process, penetration of external impurities into the display area DA may be effectively prevented due to the remaining one of the first projection 630c and the second projection 630d in which cracks do not occur.

For reference, a portion of the anti-crack projection 630 in the bending area BA is referred to as the bending portion, and the first area A1 refers to a preset area including the bending portion of the anti-crack projection 630 on the substrate 100. Accordingly, as shown in FIG. 8, a portion of the anti-crack projection 630 belonging to the first area A1 but not belonging to the bending area BA may include the first projection 630c and the second projection 630d. For example, a front end portion of the first projection 630c extending into the first area A1 from one side of the first area A1 (in the +y direction) including the bending area BA may further extend into the other side of the first area A1 (in the −y direction), and a front end portion of the second projection 630d extending into the first area A1 from the other side of the first area A1 (in the −y direction) may further extend into the one side of the first area A1 (in the +y direction). This applies to the following exemplary embodiments and modified examples thereof.

The wiring WR is disposed in a peripheral area of the substrate 100 as shown in FIG. 8. In this case, a distance d3 between an edge of the second projection 630d close to the wiring WR in the first area A1 and an edge of the wiring WR close to the second projection 630d in the first area A1 may be substantially the same as a distance d4 between an edge of the first projection 630c close to the wiring WR in the second area A2 and an edge of the wiring WR close to the first projection 630c in the second area A2. To this end, an edge of the wiring WR close to the anti-crack projection 630 may have a curved portion WRb corresponding to a position of the front end portion of the second projection 630d (in the +y direction). Since a space between the wiring WR and the anti-crack projection 630 is maintained constant through this structure, a tolerance between the wiring WR and the anti-crack projection 630 may be constant during a manufacturing process.

The anti-crack projection 630 may be covered by the cover layer 650 that is an organic layer as described above. The cover layer 650 extends along the edge 100a of the substrate 100 in a direction in which the anti-crack projection 630 extends. For the cover layer 650 to completely cover the anti-crack projection 630, a width of a portion of the cover layer 650 corresponding to a bending portion in the bending area BA may be greater than a width of a portion of the cover layer 650 corresponding to a flat portion in the second area A2.

Accordingly, an edge of the cover layer 650 may have a curved shape. As a result, a distance between an edge of the cover layer 650 close to the display area DA on the one side of the first area A1 (in the +y direction) and an edge of the display area DA close to the cover layer 650 on the one side of the first area A1 (in the +y direction) may be greater than a distance between an edge of the cover layer 650 close to the display area DA on the other side of the first area A1 (in the −y direction) and an edge of the display area DA close to the cover layer 650 on the other side of the first area A1 (in the −y direction). This is because an edge of the display area DA close to the cover layer 650 has a substantially linear shape.

Figure 9:
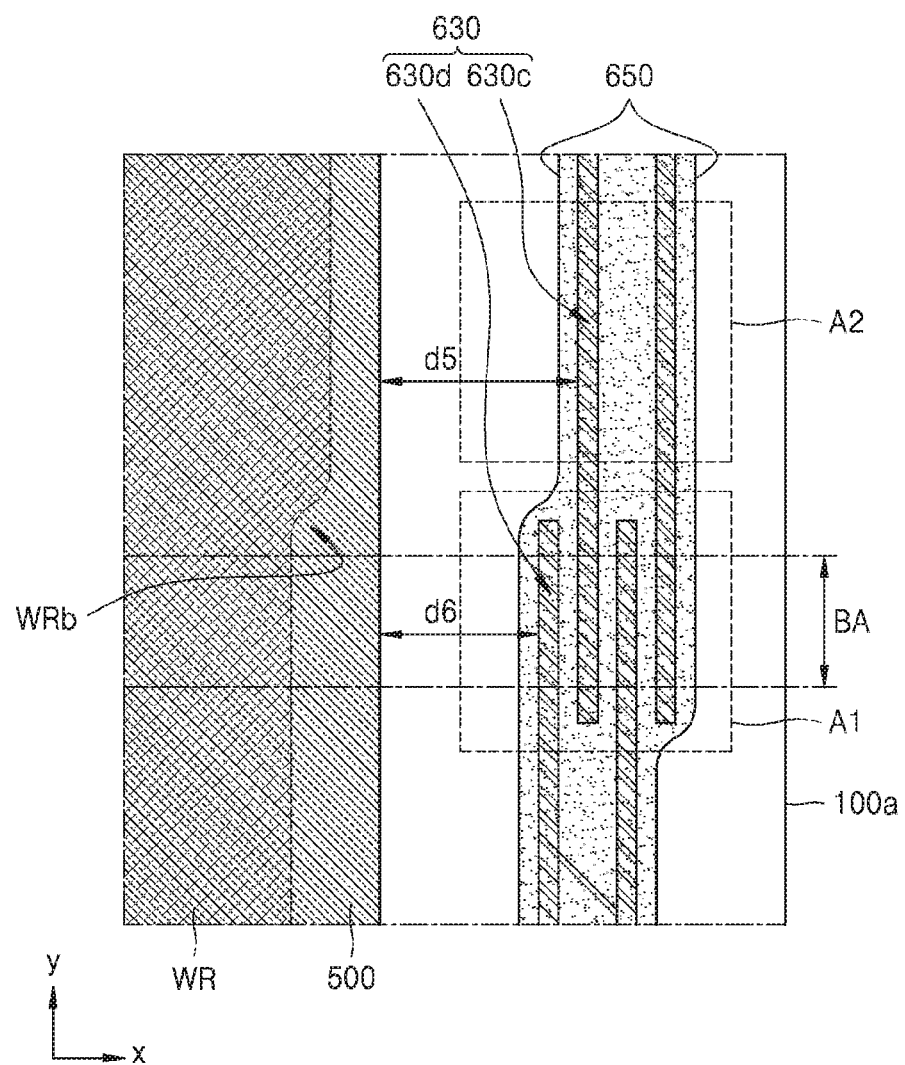

The display apparatus includes the encapsulation layer 500 covering display devices in the display area DA. As shown in FIG. 9 that is a plan view illustrating a part of a display apparatus according to an exemplary embodiment of the inventive concept, a part of the encapsulation layer 500 may extend to a peripheral area. In particular, the first inorganic encapsulation layer 510 and the second inorganic encapsulation layer 530 of the encapsulation layer 500 may extend to a vicinity of the anti-crack projection 630. In this case, a distance d6 between an edge of the encapsulation layer 500 close to the anti-crack projection 630 in the first area A1 overlapping the bending area BA and an edge of the second projection 630d close to the encapsulation layer 500 in the first area A1 may be less than a distance d5 between an edge of the encapsulation layer 500 close to the anti-crack projection 630 in the second area A2 outside the bending area BA and an edge of the first projection 630c close to the encapsulation layer 500 in the second area A2. This is because an outer edge of the encapsulation layer 500 does not have a concave portion and has a substantially linear shape.

The display apparatus according to the present exemplary embodiment may include the plurality of anti-crack projections 630. In this case, as shown in FIGS. 8 and 9, a structure including the first projection 630c and the second projection 630d may be repeatedly provided. However, the inventive concept is not limited thereto.

Figure 10:
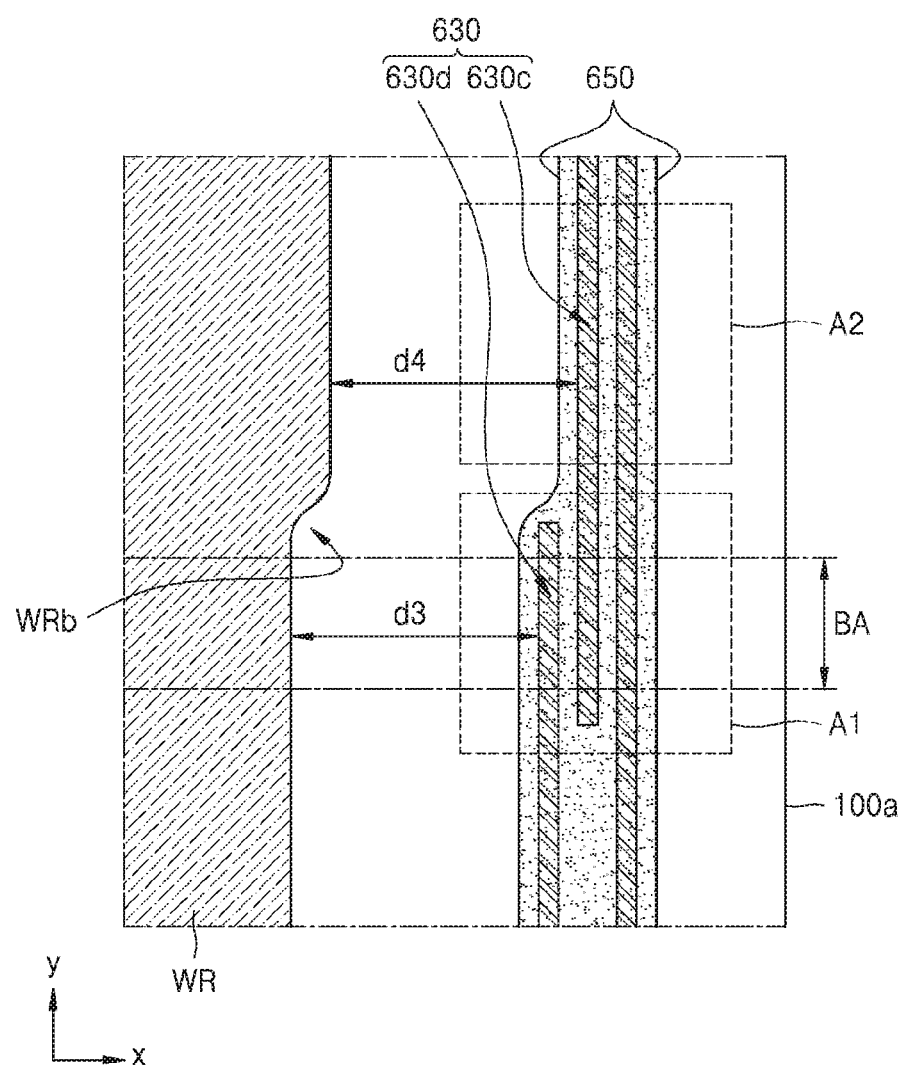

For example, as shown in FIG. 10 that is a plan view illustrating a part of a display apparatus according to an exemplary embodiment of the inventive concept, the anti-crack projection 630 disposed relatively adjacent to the display area DA includes the first projection 630c and the second projection 630d as described above, whereas the anti-crack projection 630 disposed relatively adjacent to the edge 100a of the substrate 100 may include only one dam whose width is constant in the bending area BA and an area outside the bending area BA. In this case, an edge of the cover layer 650 close to the edge 100a of the substrate 100 may have a linear shape, without being curved in the first area A1 and the second area A2. An edge of the cover layer 650 close to the display area DA may have a curved shape at a position corresponding to a front end portion of the second projection 630d.

Figure 11:
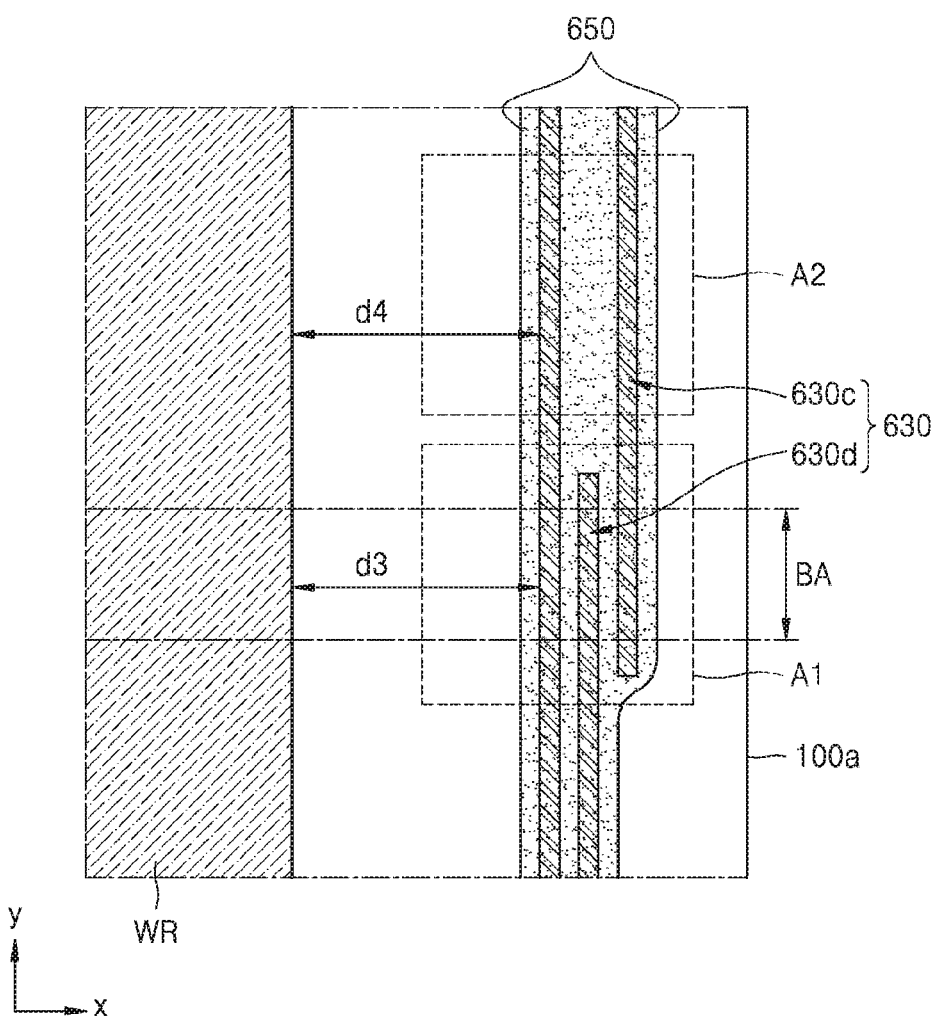

As shown in FIG. 11 that is a plan view illustrating a part of a display apparatus according to an exemplary embodiment of the inventive concept, the anti-crack projection 630 disposed relatively far from the display area DA may include the first projection 630c and the second projection 630d as described above, whereas the anti-crack projection 630 disposed relatively adjacent to the display area DA may include only one dam whose width is constant in the bending area BA and an area outside the bending area BA. In this case, an edge of the cover layer 650 close to the display area DA may have a linear shape, without being curved in the first area A1 and the second area A2. An edge of the cover layer 650 far from the display area DA may have a curved shape at a position corresponding to a front end of the first projection 630c (in the −y direction).

Figure 12:
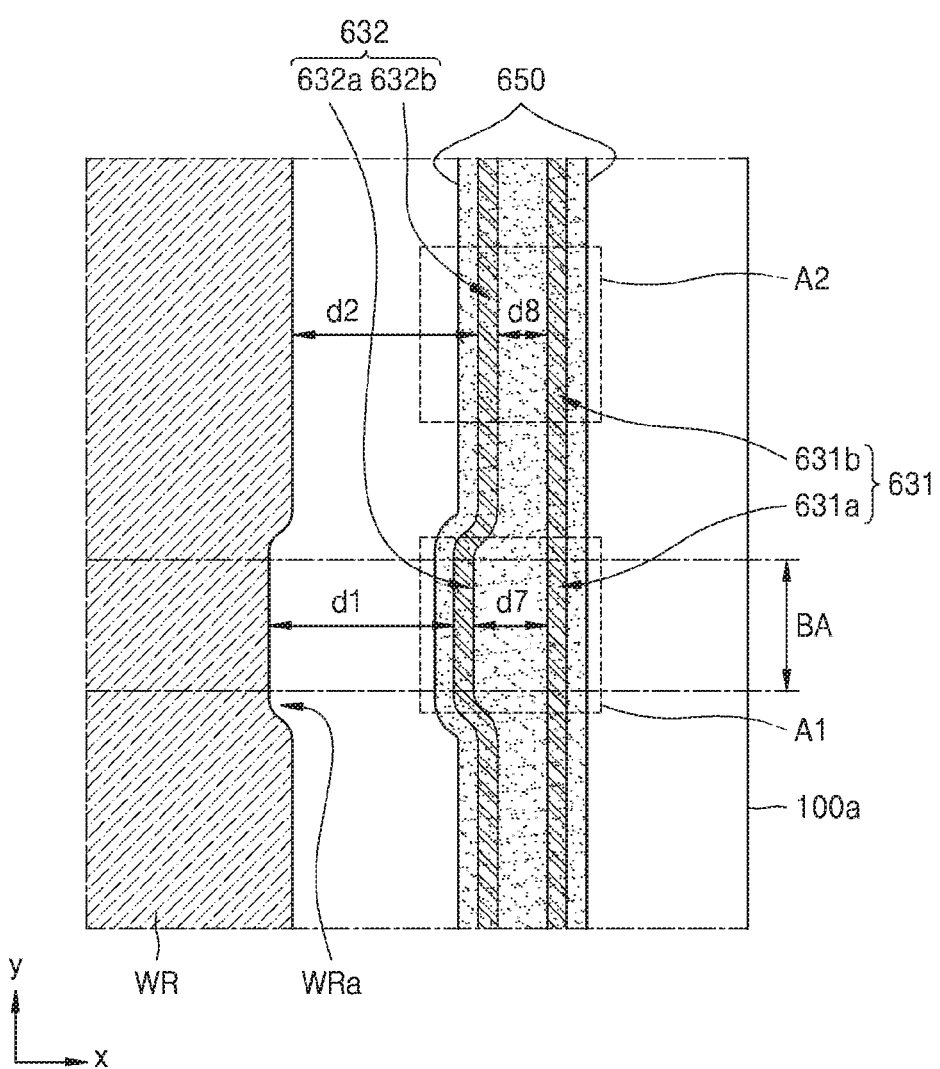

FIG. 12 is a plan view illustrating a part of a display apparatus according to an exemplary embodiment of the inventive concept. The anti-crack projection 630 included in the display apparatus according to the present exemplary embodiment includes a first anti-crack projection 631 and a second anti-crack projection 632. The first anti-crack projection 631 is disposed in a peripheral area of the substrate 100 and extends along at least a part of the edge 100a of the substrate 100. The second anti-crack projection 632 is disposed in the peripheral area of the substrate 100 to be disposed between the display area DA and the first anti-crack projection 631. The second anti-crack projection 632 also extends along at least a part of the edge 100a of the substrate 100.

Since the first anti-crack projection 631 and the second anti-crack projection 632 extend along the edge 100a of the substrate 100, a portion passes through the bending area BA and another portion is disposed outside the bending area BA. Accordingly, a portion of the first anti-crack projection 631 in the bending area BA may be referred to as a first bending portion 631a, and a portion of the second anti-crack projection 632 in the bending area BA may be referred to as a second bending portion 632a. In this case, as shown in FIG. 12, a preset area including the first bending portion 631a and the second bending portion 632a on the substrate 100 may be referred to as the first area A1. Various modifications may be made. For example, a part of the first area A1 may have a shape extending to the outside of the bending area BA, or an edge of the first area A1 may be aligned with an edge of the bending area BA (in the +y direction and the −y direction).

The second area A2 is a preset area of the substrate 100 disposed outside the first area A1. In this case, a portion of the first anti-crack projection 631 and a portion of the second anti-crack projection 632 included in the second area A2 do not belong to the bending area BA. Accordingly, a portion of the first anti-crack projection 631 and a portion of the second anti-crack projection 632 belonging to the second area A2 may be referred to as a first flat portion 631b and a second flat portion 632b, respectively, and the first flat portion 631b and the second flat portion 632b do not belong to the bending area BA.

In the display apparatus according to the present exemplary embodiment, a distance d7 between the first bending portion 631a and the second bending portion 632a in the first area A1 is greater than a distance d8 between the first flat portion 631b and the second flat portion 632b in the second area A2. To this end, the second anti-crack projection 632 may have a curved shape so that a distance between the second bending portion 632a and the display area DA is less than a distance between the second flat portion 632b and the display area DA.

The display apparatus according to the present exemplary embodiment may be bent along the bending axis BAX as described above. The display apparatus according to the present exemplary embodiment may be a display apparatus that may be bent only once, a display apparatus that may be expanded substantially flat after being bent, or a display apparatus that may be bent a plurality of times. In any case, stress may be applied to the bending area BA in a bending process, and thus cracks may occur in the bending area BA. In this case, when impurities such as external moisture or oxygen penetrate into the display area DA through the cracks, a display device in the display area DA may be damaged. In particular, in an organic light-emitting display apparatus including the organic light-emitting device 300 as a display device, since the organic light-emitting device 300 is very vulnerable to external impurities, it may be necessary to effectively prevent penetration of external impurities through the cracks.

Even when cracks occur in the first bending portion 631a including an inorganic material in the bending area BA, due to the existence of the cover layer 650 including an organic material and covering the first anti-crack projection 631 and the second anti-crack projection 632 to fill a space between the first anti-crack projection 631 and the second anti-crack projection 632, cracks occurring in the first bending portion 631a may be prevented from occurring in the second bending portion 632a. Furthermore, in the display apparatus according to the present exemplary embodiment, the distance d7 between the first bending portion 631a and the second bending portion 632a in the first area A1 is greater than the distance d8 between the first flat portion 631b and the second flat portion 632b in the second area A2. Accordingly, cracks corresponding to the cracks occurring in the first bending portion 631a may be more effectively prevented from occurring in the second bending portion 632a.

For reference, a portion of the first anti-crack projection 631 in the bending area BA is referred to as the first bending portion 631a and a portion of the second anti-crack projection 632 in the bending area BA is referred to as the second bending portion 632a, and the first area A1 refers to a preset area including the first bending portion 631a and the second bending portion 632a on the substrate 100. Accordingly, as shown in FIG. 12, a width of a portion of the first anti-crack projection 631 belonging to the first area A1 but not belonging to the bending area BA may be substantially the same as a width of the first bending portion 631a, and a width of a portion of the second anti-crack projection 632 belonging to the first area A1 but not belonging to the bending area BA may be substantially the same as a width of the second bending portion 632a. This applies to the following exemplary embodiments and modified examples thereof.

As shown in FIG. 12, the wiring WR may be disposed in the peripheral area of the substrate 100. The wiring WR may be a part of the electrode power supply line 410 of FIG. 3, or may be another wiring. The wiring WR is disposed between the second anti-crack projection 632 and the display area DA. A part of the wiring WR may extend into the display area DA. This applies to the following exemplary embodiments and modified examples thereof. The wiring WR may extend along at least a part of the edge 100a of the substrate 100. In FIG. 12, the wiring WR extends in the y-axis direction.

In this case, a distance between an edge of the wiring WR close to the second anti-crack projection 632 (in the +x direction) and an edge of the second anti-crack projection 632 close to the wiring WR may be substantially the same in the first area A1 and the second area A2. For example, a distance d1 between an edge of the second bending portion 632a close to the wiring WR in the first area A1 and an edge of the wiring WR close to the second bending portion 632a in the first area A1 may be substantially the same as a distance d2 between an edge of the second flat portion 632b close to the wiring WR in the second area A2 and an edge of the wiring WR close to the second flat portion 632b in the second area A2. To this end, the edge of the wiring WR close to the second anti-crack projection 632 may have the concave portion WRa recessed inward to correspond to the second bending portion 632a of the second anti-crack projection 632. Since a space between the wiring WR and the second anti-crack projection 632 is maintained constant through this structure, a tolerance between the wiring WR and the second anti-crack projection 632 may be constant in a manufacturing process.

The first anti-crack projection 631 and the second anti-crack projection 632 may be covered by the cover layer 650 that is an organic layer as described above. The cover layer 650 extends along the edge 100a of the substrate 100 in a direction in which the first anti-crack projection 631 and the second anti-crack projection 632 extend. For the cover layer 650 to completely cover the first anti-crack projection 631 and the second anti-crack projection 632, a width of a portion of the cover layer 650 corresponding to the second bending portion 632a may be greater than a width of a portion of the cover layer 650 corresponding to the second flat portion 632b. Accordingly, the cover layer 650 may have a convex portion that is convex toward the display area DA to correspond to the second bending portion 632a of the second anti-crack projection 632.

Figure 13:
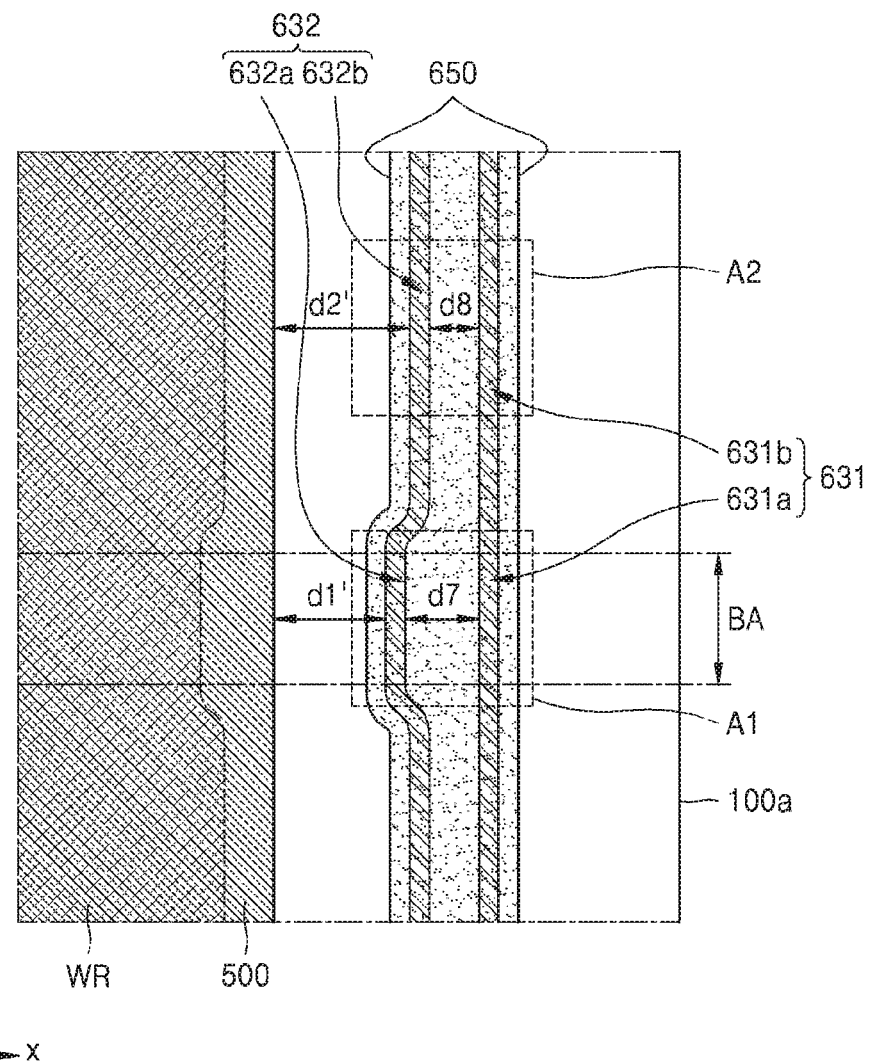

The display apparatus includes the encapsulation layer 500 covering display devices in the display area DA, and, as shown in FIG. 13 that is a plan view illustrating a part of a display apparatus according to an exemplary embodiment of the inventive concept, a part of the encapsulation layer 500 may extend to the peripheral area. In particular, the first inorganic encapsulation layer 510 and the second inorganic encapsulation layer 530 of the encapsulation layer 500 may extend to a vicinity of the anti-crack projection 630. In this case, a distance d1' between an edge of the encapsulation layer 500 close to the second anti-crack projection 632 in the first area A1 overlapping the bending area BA and an edge of the second anti-crack projection 632 close to the encapsulation layer 500 in the first area A1 may be less than a distance d2' between an edge of the encapsulation layer 500 close to the second anti-crack projection 632 in the second area A2 outside the bending area BA and an edge of the second anti-crack projection 632 close to the encapsulation layer 500 in the second area A2. This is because an outer edge of the encapsulation layer 500 does not have a concave portion and has a substantially linear shape.

Figure 14:
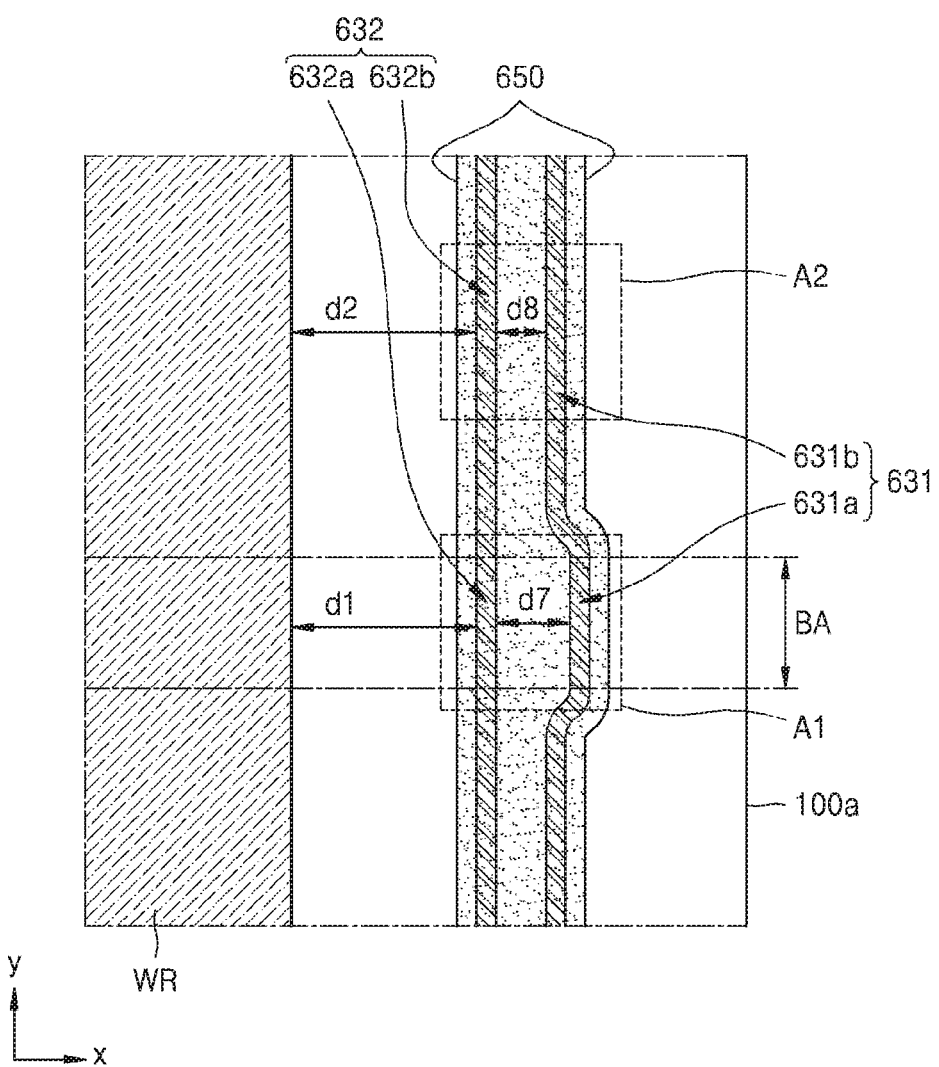

Although the second anti-crack projection 632 has a curved shape to correspond to the bending area BA and the first anti-crack projection 631 has a substantially linear shape in the bending area BA and an area around the bending area BA, the inventive concept is not limited thereto. For example, as shown in FIG. 14 that is a plan view illustrating a part of a display apparatus according to an exemplary embodiment of the inventive concept, the first anti-crack projection 631 may have a curved shape to correspond to the bending area BA, and the second anti-crack projection 632 may have a substantially linear shape in the bending area BA and an area around the bending area BA. Accordingly, a distance between the first bending portion 631a and the display area DA may be greater than a distance between the first flat portion 631b and the display area DA. In this case, the cover layer 650 may have a convex portion that is convex toward the edge 100a of the substrate 100 to correspond to the first bending portion 631a of the first anti-crack projection 631.

Figure 15:
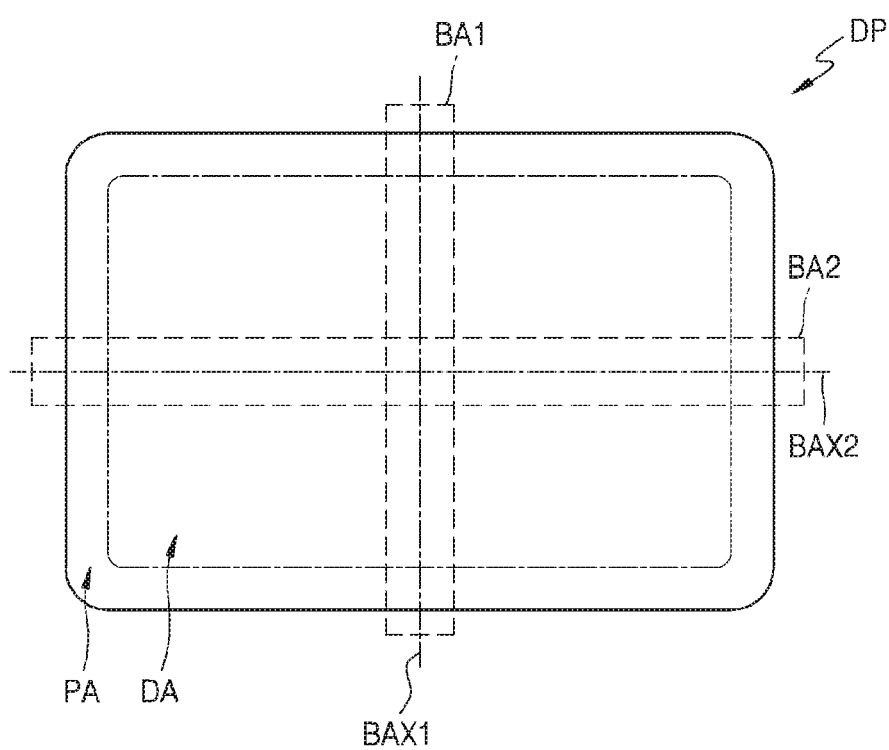

Although only one bending axis is illustrated in the above-described exemplary embodiments, the inventive concept is not limited thereto. For example, in a display apparatus according to an exemplary embodiment of the inventive concept, a bending axis may include a first bending axis and a second bending axis, and a bending area may include a first bending area and a second bending area that are not substantially the same. For example, as shown in FIG. 15 that is a plan view, the display apparatus DP may have a first bending axis BAX1 and a second bending axis BAX2 that intersects the first bending axis BAX1. Accordingly, the display apparatus DP may include a first bending area BA1 that is bent or may be bent along the first bending axis BAX1 and a second bending area BA2 that is bent or may be bent along the second bending axis BAX2.

Figure 16:
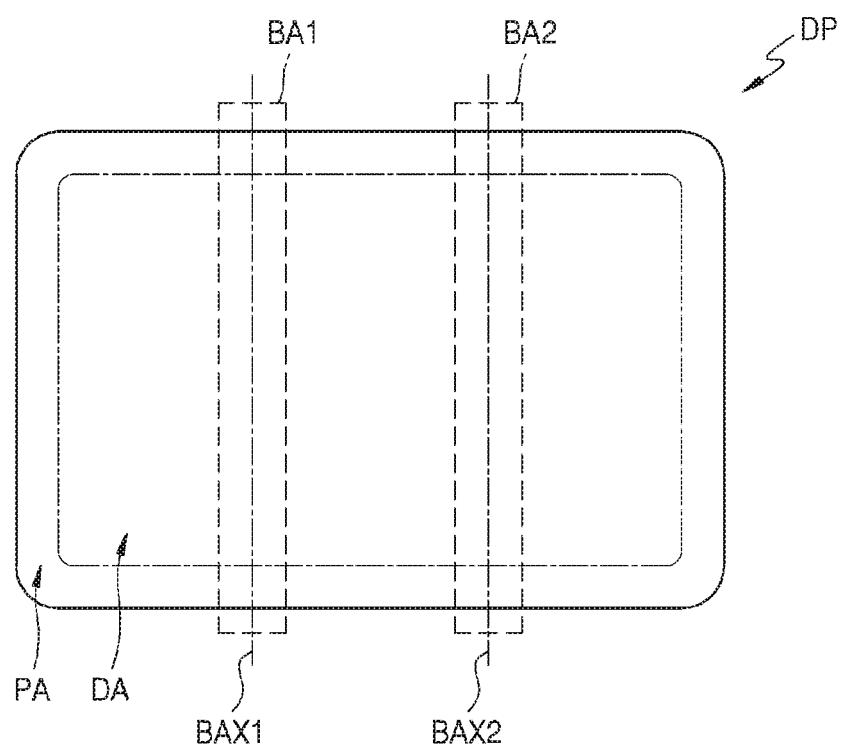
Figure 17:
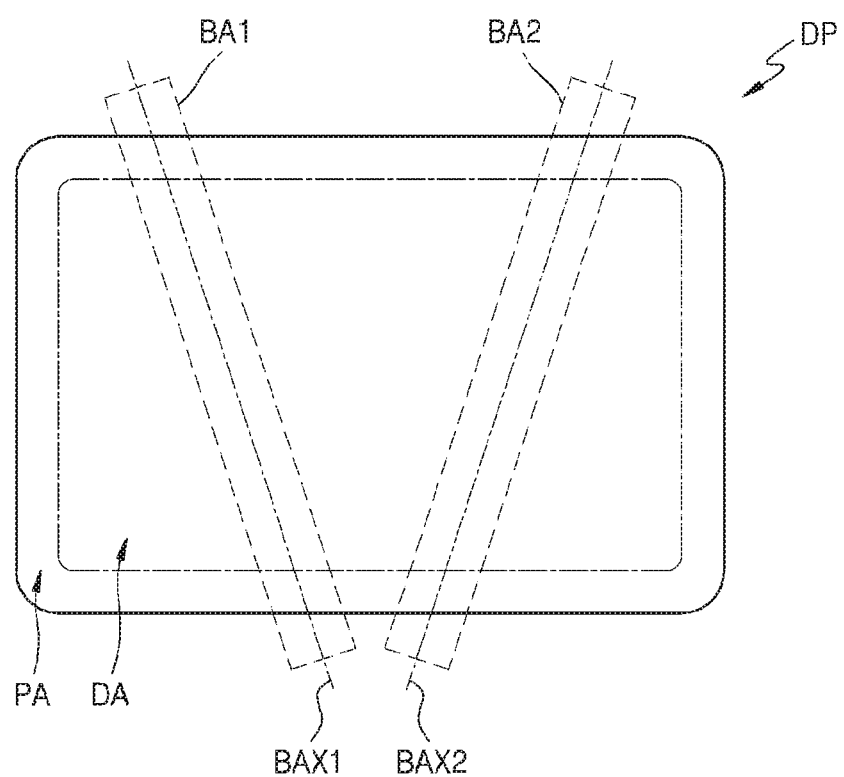

In FIG. 15, the first bending axis BAX1 and the second bending axis BAX2 pass through the center of the display apparatus DP and are substantially perpendicular to each other. However, various modifications may be made. For example, as shown in FIG. 16, the first bending axis BAX1 and the second bending axis BAX2 may not pass through the center of the display apparatus DP and may be substantially parallel to each other, and as shown in FIG. 17, the first bending axis BAX1 and the second bending axis BAX2 may not pass through the center of the display apparatus DP and may not be parallel to each other. Furthermore, the bending axis may further include a bending axis in addition to the first bending axis BAX1 and the second bending axis BAX2.

In any case, portions in the first bending area BA1 or portions in the second bending area BA2 and belonging to the peripheral area PA outside the display area DA may have substantially the same structure as that described with reference to FIGS. 3 through 14.

Thus, as described above, according to exemplary embodiments of the inventive concept, a display apparatus for preventing or minimizing defects in a manufacturing process may be realized.

While the inventive concept has been shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A display apparatus comprising:
 a substrate comprising a display area where display devices are disposed, a peripheral area outside the display area, and a bending area bendable along a bending axis;
 an anti-crack projection disposed in the peripheral area of the substrate and extending along at least a part of an edge of the substrate; and
 a wiring disposed in the peripheral area of the substrate between the anti-crack projection and the display area, and extending along at least a part of the edge of the substrate,
 wherein a portion of the anti-crack projection in the bending area is a bending portion,
 a preset area comprising the bending portion on the substrate is a first area,
 a preset area of the substrate disposed outside the first area, having substantially the same area as that of the first area, and comprising a part of the anti-crack projection is a second area, a portion of the anti-crack projection belonging to the second area is a flat portion,
an area occupied by the bending portion in the first area is greater than an area occupied by the flat portion in the second area,
the bending portion is continuous,
the anti-crack projection and the wiring extend in a first direction,
a width of the bending portion in a second direction perpendicular to the first direction is greater than a width of the flat portion in the second direction, and
a distance between an edge of the bending portion and an edge of the wiring is substantially constant throughout the bending portion.

2. The display apparatus of claim 1,
wherein a distance between an edge of the wiring close to the anti-crack projection and an edge of the anti-crack projection close to the wiring is substantially the same in the first area and the second area.

3. The display apparatus of claim 1,
wherein an edge of the wiring close to the anti-crack projection has a concave portion recessed inward away from the bending portion to correspond to the bending portion.

4. The display apparatus of claim 1, further comprising a cover layer covering the anti-crack projection and extending in the first direction in which the anti-crack projection extends.

5. The display apparatus of claim 4, wherein a width of a portion of the cover layer corresponding to the bending portion is greater than a width of a portion of the cover layer corresponding to the flat portion.

6. The display apparatus of claim 4, wherein the cover layer comprises a convex portion that is convex toward the display area to correspond to the bending portion and a convex portion that is convex away from the display area.

7. The display apparatus of claim 1, further comprising an encapsulation layer covering the display devices in the display area and extending to the peripheral area,
wherein a distance between an edge of the encapsulation layer close to the anti-crack projection and an edge of the anti-crack projection close to the encapsulation layer in the second area is greater than that in the first area.

8. The display apparatus of claim 1, wherein the anti-crack projection comprises a first projection extending into the first area from a first side of the first area and a second projection extending into the first area from a second side of the first area, and
wherein the second projection in the first area is disposed closer to the display area than the first projection, and the bending portion comprises a part of the first projection and a part of the second projection.

9. The display apparatus of claim 8,
wherein a distance between an edge of the wiring close to the second projection and an edge of the second projection close to the wiring in the first area is substantially the same as a distance between an edge of the wiring close to the first projection and an edge of the first projection close to the wiring in the second area.

10. The display apparatus of claim 9, wherein an edge of the wiring close to the anti-crack projection has a curved portion corresponding to a position of a front end portion of the second projection.

11. The display apparatus of claim 8, further comprising a cover layer covering the anti-crack projection and extending in the first direction in which the anti-crack projection extends.

12. The display apparatus of claim 11, wherein a width of a portion of the cover layer corresponding to the bending portion is greater than a width of a portion of the cover layer corresponding to the flat portion.

13. The display apparatus of claim 11, wherein a distance between an edge of the cover layer close to the display area and an edge of the display area close to the cover layer on the first side of the first area is greater than a distance between an edge of the cover layer close to the display area and an edge of the display area close to the cover layer on the second side of the first area.

14. The display apparatus of claim 8, further comprising an encapsulation layer covering the display devices in the display area and extending to the peripheral area, and
wherein a distance between an edge of the encapsulation layer close to the first projection and an edge of the first projection close to the encapsulation layer on the first side of the first area is greater than a distance between an edge of the encapsulation layer close to the second projection and an edge of the second projection close to the encapsulation layer on the second side of the first area.

15. The display apparatus of claim 1, wherein the bending axis comprises a first bending axis and a second bending axis that are different, and the bending area comprises a first bending area and a second bending area that are different.

16. A display apparatus comprising:
a substrate comprising a display area where display devices are disposed, a peripheral area outside the display area, and a bending area bendable along a bending axis;
an anti-crack projection disposed in the peripheral area of the substrate and extending along at least a part of an edge of the substrate; and
a cover layer covering the anti-crack projection and extending in a first direction in which the anti-crack projection extends,
wherein a portion of the anti-crack projection in the bending area is a bending portion,
a preset area comprising the bending portion on the substrate is a first area,
a preset area of the substrate disposed outside the first area, having substantially the same area as that of the first area, and comprising a part of the anti-crack projection is a second area,
a portion of the anti-crack projection belonging to the second area is a flat portion,
an area occupied by the bending portion in the first area is greater than an area occupied by the flat portion in the second area,
the bending portion is continuous,
a width of the bending portion in a second direction perpendicular to the first direction is greater than a width of the flat portion in the second direction, and
the cover layer comprises a convex portion that is convex toward the display area to correspond to the bending portion and a convex portion that is convex away from the display area.

* * * * *